(12) United States Patent
Hagiwara

(10) Patent No.: US 7,791,718 B2
(45) Date of Patent: Sep. 7, 2010

(54) MEASUREMENT METHOD, EXPOSURE METHOD, AND DEVICE MANUFACTURING METHOD

(75) Inventor: Tsuneyuki Hagiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 158 days.

(21) Appl. No.: 11/576,379

(22) PCT Filed: Sep. 30, 2005

(86) PCT No.: PCT/JP2005/018084

§ 371 (c)(1),
(2), (4) Date: Sep. 14, 2007

(87) PCT Pub. No.: WO2006/035925

PCT Pub. Date: Apr. 6, 2006

(65) Prior Publication Data

US 2008/0068595 A1     Mar. 20, 2008

(30) Foreign Application Priority Data

Sep. 30, 2004   (JP)   .............................. 2004-287178

(51) Int. Cl.
*G01B 9/00* (2006.01)
(52) U.S. Cl. ...................................... 356/124; 356/121
(58) Field of Classification Search ......... 356/121–124, 356/229, 520, 237.1–237.6, 218, 213, 394, 356/239.7, 399–401, 222, 445–448; 430/5, 430/296; 250/548, 559.3, 492.22, 492.24; 716/19–21; 355/67–68, 43
See application file for complete search history.

(56) References Cited

U.S. PATENT DOCUMENTS 5,638,207 A     6/1997   Fukuzawa et al.

(Continued)

FOREIGN PATENT DOCUMENTS

JP            2 3907         1/1990

(Continued)

*Primary Examiner*—Gregory J Toatley, Jr.
*Assistant Examiner*—Tri T Ton
(74) *Attorney, Agent, or Firm*—Oblon, Spivak, McClelland, Maier & Neustadt, L.L.P.

(57) ABSTRACT

Light is irradiated on a light-shielding pattern on an object surface side of a projection optical system, and light intensity distribution of the light having passed through the projection optical system and slits is detected while slits of an aerial image measuring unit on the image plane side of the projection optical system are moved within a plane perpendicular to the optical axis of the projection optical system, The information concerning the flare of the projection optical system is computed from the light intensity distribution, so that the influence of resist coated on a wafer used in a conventional exposing method can be eliminated, and highly accurate measurement of information concerning the flare can be realized. Further, measurement of information concerning the flare can be performed in a short time comparing to the exposing method because development process or the like of the wafer is not necessary.

18 Claims, 16 Drawing Sheets

U.S. PATENT DOCUMENTS

| | | |
|---|---|---|
| 5,905,569 A | 5/1999 | Suzuki |
| 6,835,507 B2 | 12/2004 | Ki et al. |
| 6,900,887 B2 | 5/2005 | Kim |
| 2004/0021854 A1 | 2/2004 | Hikima |
| 2004/0196447 A1 | 10/2004 | Watanabe |
| 2005/0083518 A1 | 4/2005 | Ki et al. |
| 2005/0270523 A1 | 12/2005 | Wu et al. |
| 2005/0275820 A1 | 12/2005 | Fukuhara et al. |
| 2006/0210885 A1* | 9/2006 | Ziger et al. ............ 430/5 |

FOREIGN PATENT DOCUMENTS

| | | |
|---|---|---|
| JP | 5 55104 | 3/1993 |
| JP | 8 179513 | 7/1996 |
| JP | 2003 318095 | 11/2003 |
| WO | 02 09163 | 1/2002 |

\* cited by examiner

MEASUREMENT METHOD, EXPOSURE METHOD, AND DEVICE MANUFACTURING METHOD

TECHNICAL FIELD

The present invention relates to a measurement method and exposure method, more particularly to a measurement method in which information concerning flare of a projection optical system is measured, an exposure method using the measurement method, and a device manufacturing method using the exposure method.

BACKGROUND ART

In forming a fine pattern of an electronic device such as a semiconductor device (integrated circuit or the like) and a liquid crystal display device, a transfer method is used where a pattern of a mask or a reticle, on which a pattern to be formed is formed by proportionally magnifying by about four to five times thereinafter, generally referred to as "reticle"), is reduced on an object to be exposed such as a wafer by using a projection exposure apparatus.

The projection exposure apparatus has shifted its exposure wavelength to a shorter wavelength side in order to cope with microfabrication of circuit patterns associated with higher integration of a semiconductor device (integrated circuit). Currently, as the wavelength, 248 nm of KrF excimer laser and 193 nm of ArF excimer laser being shorter wavelength are mainly used.

In the projection exposure apparatus, with shorter wavelength of exposure wavelength, light quantity of flare caused by fine polishing residue or flaw left on the surface of optical members (such as lens and mirror) constituting a projection optical system and light quantity of flare generated due to the unevenness of a lens material have become a problem. The flare is local flare that appear in the vicinity of the edge of the image of a light-shielding pattern on an image plane and a global flare spreading outside the local flare.

Particularly, the local flare varies depending on the density of a pattern being a focus of attention regarding the flare quantity of its vicinity, and OPE (Optical Proximity Effect) characteristics is affected thereby.

Flare measurement in the projection optical system of a projection exposure apparatus is currently performed by a method called an "exposing method", in which a pattern for flare measurement formed on a reticle for measurement is actually transferred onto a resist layer on a wafer via the projection optical system (refer to Patent Document 1 for example).

In the exposing method, for example, an $E_{th}/E_0$ method is known in which a square light-shielding mark whose one side is d, as shown in FIG. 17 is used as a flare measurement mark, and a ratio ($E_{th}/E_0$) between optimum exposure quantity $E_{th}$ where a resist image (an image of a mark formed on the resist layer on a wafer surface after the wafer is developed, which is obtained by transferring the flare measurement mark onto the resist layer of the wafer, becomes a predetermined size and excessive exposure quantity $E_0$ where the resist image is completely disappeared is used as an index of flare. Note that the ratio ($E_{th}/E_0$) by the exposing method should be called as a contrast value C hereinafter.

In the $E_{th}/E_0$ method by the exposing method a line pattern may also be used as disclosed in Patent Document 1. In addition, as a method of flare measurement by the exposing method, a line width measurement method is also known in which the line width of a resist image of a predetermined mark for measurement (line-and-space mark, for example) is used as the index of flare.

However, in the flare measurement by the above-described exposing method, since it is necessary to go through a development process or the like of the object be exposed such as the wafer, the measurement requires a long period of time, and the flare measurement is one of the causes of reduction of throughput in a series of processing in the projection exposure apparatus. Further, because a measurement process of resist image is included, if environment in a coating process of resist, a development process or the like is varied, this might affect the measurement values of the resist image, and highly accurate flare measurement may become difficult.

[Patent Document 11] Kokai (Japanese Unexamined Patent Application Publication) No. 2003-318095

DISCLOSURE OF INVENTION

Means for Solving the Problems

The present invention has been made in consideration of the situation described above and according to a first aspect of the present invention, there is provided a measurement method in which information concerning the flare of a projection optical system is measured, which includes: a first process in which light is irradiated on a light-shielding pattern placed on the object surface side of the projection optical system and the light intensity distribution of light having passed through the projection optical system is detected; and a second process in which the information concerning the flare of the projection optical system is computed from the light intensity distribution detected on the first process.

Thus, development process of a substrate or the like is not necessary unlike the above-described exposing method so that the measurement of information concerning flare can be performed in a short time comparing to the exposing method. Further, since the above-described influence of resist can be eliminated highly accurate measurement of information concerning flare is made possible.

According to a second aspect of the present invention, there is provided a first exposure method including: a process in which the information concerning the flare of the projection optical system is measured by the measurement method of the present invention; and a process in which a pattern formed on a mask is transferred onto a substrate by taking the measured information concerning flare in consideration.

Thus, the information concerning the flare of a projection optical system is measured in a short time and highly accurately by the measurement method of the present invention, and the pattern formed on the mask is transferred onto the substrate by taking the measured information concerning flare in consideration. Therefore, it becomes possible to transfer the pattern onto the substrate with good accuracy in the state where the influence of flare is reduced.

According to a third aspect of the present invention, there is provided a second exposure method including a process in which the information concerning the flare of the projection optical system is measured by the measurement method of the present invention; a process in which a pattern to be formed on a mask is decided by taking the measured information concerning flare in consideration, and the pattern is formed on the mask; and a process in which the pattern formed on the mask is transferred onto the substrate.

Thus, the information concerning the flare of the projection optical system is measured in a short time and highly accurately by the measurement method of the present invention, a pattern to be formed on the mask is decided by taking the measured information concerning flare in consideration, and the pattern is formed on the mask. Then, the pattern formed on the mask is transferred onto the substrate. Thus, it becomes possible to form a transferred image of the pattern with a desired size on the substrate.

Further, in a lithography process, by transferring the pattern formed on the mask onto the substrate using the first and the second exposure methods of the present invention, it becomes possible to improve the productivity of a highly integrated microdevice. Therefore, further according to another aspect, the present invention is also a device manufacturing method using the exposure method of the present invention.

BEST MODE FOR CARRYING OUT THE INVENTION

Hereinafter, description will be made for an embodiment of the present invention based on FIG. 1 to FIG. 12.

Figure 1:
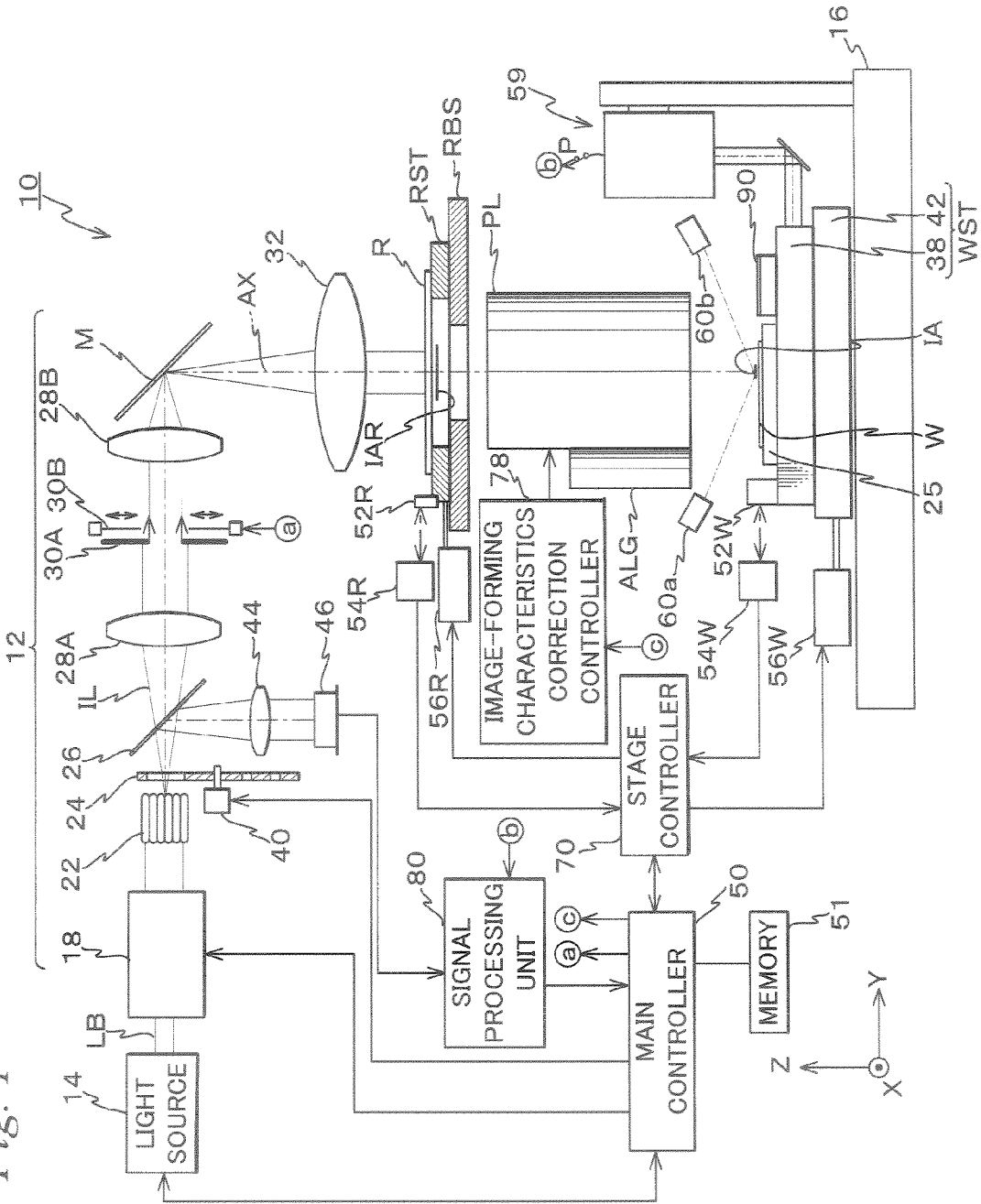
FIG. 1 is a schematic view showing an exposure apparatus according to an embodiment.

FIG. 1 shows the schematic configuration of an exposure apparatus 10 according to an embodiment to which the measurement method and the exposure method of the present invention are applied. Exposure apparatus 10 is a scanning projection exposure apparatus by a step-and-scan method, that is, a so-called scanning stepper.

Exposure apparatus 10 is equipped with: an illumination system including a light source 14 and an illumination optical system 12; a reticle stage RST as a mask stage that holds a reticle R as a mask; a projection optical system PL; a wafer stage WST as an object stage that holds a wafer W as an object and is freely movable within an XY plane; a control system that controls these sections; and the like. Further, although omitted in the drawings, of each of the above-described constituent portions, portions other than the light source and the control system are actually housed inside an environment-control chamber (environmental chamber) (not shown), where the environmental conditions such as internal temperature and pressure are maintained highly accurately.

As light source 14 in this case, an excimer laser light source outputting KrF excimer laser light (wavelength: 248 nm) or ArF excimer laser light (wavelength: 193 nm) is to be used as an example. The ON/OFF, central wavelength, half spectral band width, repetition frequency or the like of the laser emission of light source 14 is controlled by a main controller 50.

Illumination optical system 12 is equipped with: a beam-shaping optical system 18; a fly-eye lens 22 as an optical integrator (homogenizer); an illumination system aperture stop plate 24; a relay optical systems (28A, 28B); a fixed reticle blind 30A; a movable reticle blind 30B; a mirror M; a condenser lens 32 and the like. Note that a rod type (internal reflection type) integrator, a diffraction optical element or the like can also be used as the optical integrator.

In beam-shaping optical system 18, for example, a cylinder lens, a beam expander (both are omitted in the drawings) and the like are included which is used to shape the cross-section shape of a laser beam LB that is a pulsed light emitted by light source 14 so that laser beam LB is efficiently incident on fly-eye lens 22 arranged in the rear of the optical path of laser beam LB.

Fly-eye lens 22 is placed on the optical path of laser beam LB outgoing from beam-shaping optical system 18, and forms a surface light source that is composed of a large number of point light sources (light source images), that is, a secondary light source, in order to illuminate reticle R with uniform illuminance distribution. Laser beam LB emitted from the secondary light source is to be called an "illumination light IL" in this specification.

Illumination system aperture stop plate 24 that is composed of a disc-shaped member is placed in the vicinity of the focal plane on the emission side of fly-eye lens 22. On illumination system aperture stop plate 24, for example, an aperture stop that is composed of a conventional circular opening (regular stop, an aperture stop (small σ stop) that is composed of a small circular opening and used for making a σ value being a coherence factor smaller, a ring-shaped aperture stop (annular stop) for annular illumination, a modified aperture stop that is formed by placing a plurality of openings to be eccentric for a modified light source method (aperture stop for quadrupole illumination use, which is also called a SHRINC, for example) and the like are placed substantially equiangularly. Illumination system aperture stop plate 24 is rotated by a drive unit 40 such as a motor controlled by main controller 50 by which any one of the aperture stops is selectively set on the optical path of illumination light IL.

A beam splitter 26 having small reflectance and large transmittance is placed on the optical path of Illumination light IL outgoing from illumination system aperture stop plate 24, and furthermore, the relay optical systems (28A, 28B) are placed in the rear of the optical path with a fixed reticle blind 30A and a movable reticle blind 30B arranged in between.

Fixed reticle blind 30A is placed on a conjugate plane with respect to the pattern surface of reticle R or in the vicinity thereof, and a rectangular opening that defines a slit-shaped illumination area IAR extending on reticle R in an X-axis direction (an orthogonal direction to the page surface of FIG. 1) is formed. Further, movable reticle blind 30B having an opening section whose position and width in directions severally corresponding to a scanning direction (herein, a Y-axis direction being a lateral direction on the page surface of FIG. 1) and a non-scanning direction (the X-axis direction) are variable, is placed in the vicinity of fixed reticle blind 30A. Movable reticle blind 30B has a pair of L-shaped blades, for example, and the pair of L-shaped blades forms the opening section described above. By further limiting illumination area TAR via movable reticle blind 30B at the starting time and the ending time of scanning exposure, exposure of an unnecessary area is prevented. Further, in the embodiment, movable reticle blind 30B is also used for setting the illumination area when measuring an aerial image (to be described later).

Meanwhile, a condenser lens 44 and an integrator sensor 46, which is composed of a light-receiving element such as a PIN type photodiode having good sensitivity in a deep ultraviolet region and high responding frequency for detecting pulse light emission of light source 14, are placed on the optical path of illumination light IL reflected off beam splitter 26 in illumination optical system 12.

The operation of the illumination system constituted in this manner will be briefly described. After laser beam LB that is a pulsed light emitted from light source 14 is made incident on beam-shaping optical system 18 where the cross-section shape is shaped so that laser beam LB is efficiently incident on fly-eye lens 22 arranged behind beam-shaping optical system 18, laser beam LB is made incident on fly-eye lens 22. Thus, the secondary light source is formed on the focal plane on the emission side of fly-eye lens 22 (a pupil plane of illumination optical system 12). Illumination light IL emitted from the secondary light source reaches beam splitter 26 having large transmittance and small reflectance after passing through one of the aperture stops on illumination system aperture stop plate 24. Illumination light IL having transmitted beam splitter 26, after passing through the rectangular opening section of fixed reticle blind 30A and the opening of movable reticle blind 30B via first relay lens 28A, passes through second relay lens 28B and its optical path is deflected perpendicularly downward by mirror M. Then, the light passes through condenser lens 32, and illuminates illumination area IAR on reticle R held on reticle stage RST with uniform illuminance distribution.

On the other hand, illumination light IL reflected off beam splitter 26 is received by integrator sensor 46 via condenser lens 44, and a photoelectric conversion signal of integrator sensor 46 is supplied to main controller 50 via a peak hold circuit (not shown) and a signal processing unit 80 having an A/D converter.

A reticle R is fixed on reticle stage RST by vacuum suction (or electrostatic suction) for example. In this case, reticle stage RST is finely drivable two-dimensionally within the XY plane perpendicular to an optical axis AX of projection optical system PL (described later) (the X-axis direction, the Y-axis direction orthogonal to the X-axis direction, and a rotation direction around a Z-axis (a $\theta z$ direction) orthogonal to the XY plane) by a reticle stage drive system 56R including a linear motor or the like, and also drivable on a reticle base RBS at designated scanning speed in the Y-axis direction.

A movable mirror 52R that reflects the laser beam from a reticle laser interferometer (hereinafter, referred to as a "reticle interferometer") 54R is fixed on reticle stage RST, and the position of reticle stage RST within the XY plane is constantly detected by reticle interferometer 54R at the resolving power of, for example, about 0.5 to 1 nm. Herein, in actual, a movable mirror having a reflection surface orthogonal to a scanning direction (the Y-axis direction) on scanning exposure and a movable mirror having a reflection surface orthogonal to a non-scanning direction (the X-axis direction) are arranged on reticle stage RST, and a reticle Y interferometer and a reticle X interferometer are arranged corresponding to these movable mirrors. However, they are representatively shown as movable mirror 52R and reticle interferometer 54R in FIG. 1. Meanwhile, for example, the reflection surface (equivalent to the reflection surface of movable mirror 52R) may be formed mirror-polishing the end surface of reticle stage RST. Further, instead of a reflection surface extending in the X-axis direction, which is used for positional detection of reticle stage RST in the scanning direction (the Y-axis direction in the embodiment) at least one corner cube mirror (such as a retroreflector) may be used. Herein, one of the reticle X interferometer and the reticle Y interferometer, for example, the reticle Y interferometer is a dual-axis interferometer having two measuring axes, and can measure a rotation around the Z-axis (the $\theta z$ rotation) in addition to the Y-position of reticle stage RST based on the measurement value of reticle Y interferometer.

Positional information of reticle stage RST from reticle interferometer 54R is sent to a stage controller 70 and to main controller 50 via stage controller 70. Stage controller 70 controls movement of reticle stage RST via reticle stage drive system 56R in response to instructions of main controller 50.

Projection optical system PL is placed below reticle stage RST in FIG. 1 and the direction of its optical axis AX is the Z-axis direction. In this case, as projection optical system PL, a bilateral telecentric reduction system, which is a dioptric system composed of a plurality of lens elements placed along an optical axis AX direction at predetermined spacing, is used. The projection magnification of projection optical system PL is, for example, ¼, ⅕ or the like. Therefore, when illumination light IL from illumination optical system 12 illuminates slit-shaped illumination area IAR on reticle R, illumination light IL having passed through reticle R forms a reduced image (partially reduced image) of a circuit pattern of reticle R in slit-shaped illumination area IAR on an exposure area IA, which is conjugate with illumination area IAR, on wafer W whose surface is coated with resist (photosensitive agent), via projection optical system PL.

Projection optical system PL is constituted by the plurality of lens elements, and a part of the plurality of lens elements (hereinafter, referred to as "movable lenses") is constituted to be finely drivable in the optical axis AX direction and a tilted direction with respect to the XY plane by a drive element (not shown) (such as piezoelectric element). Drive voltage of each drive element (a drive amount of the drive element) is controlled by an image-forming characteristics correction controller 78 in response to a command from main controller 50, and with this operation, the image-forming characteristics of projection optical system PL such as curvature of image plane, distortion, magnification, spherical aberration, astigmatism and coma are corrected.

Wafer stage WST includes an XY stage 42 and a Z-tilt stage 38 mounted on XY stage 42.

XY stage 42 is supported by levitation above the upper surface of a wafer base 16 by an air bearing (not shown), for example, with the clearance of around a few μm, and is constituted to be drivable two-dimensionally in the Y-axis direction being a scanning direction and the X-axis direction orthogonal to the Y-axis direction by a linear motor (not shown) or the like that constitutes a wafer stage drive system 56W. Z-tilt stage 38 is mounted on XY stage 42 and a wafer holder 25 is mounted on Z-tilt stage 38. Wafer holder 25 holds wafer W by vacuum suction or the like.

Figure 3:
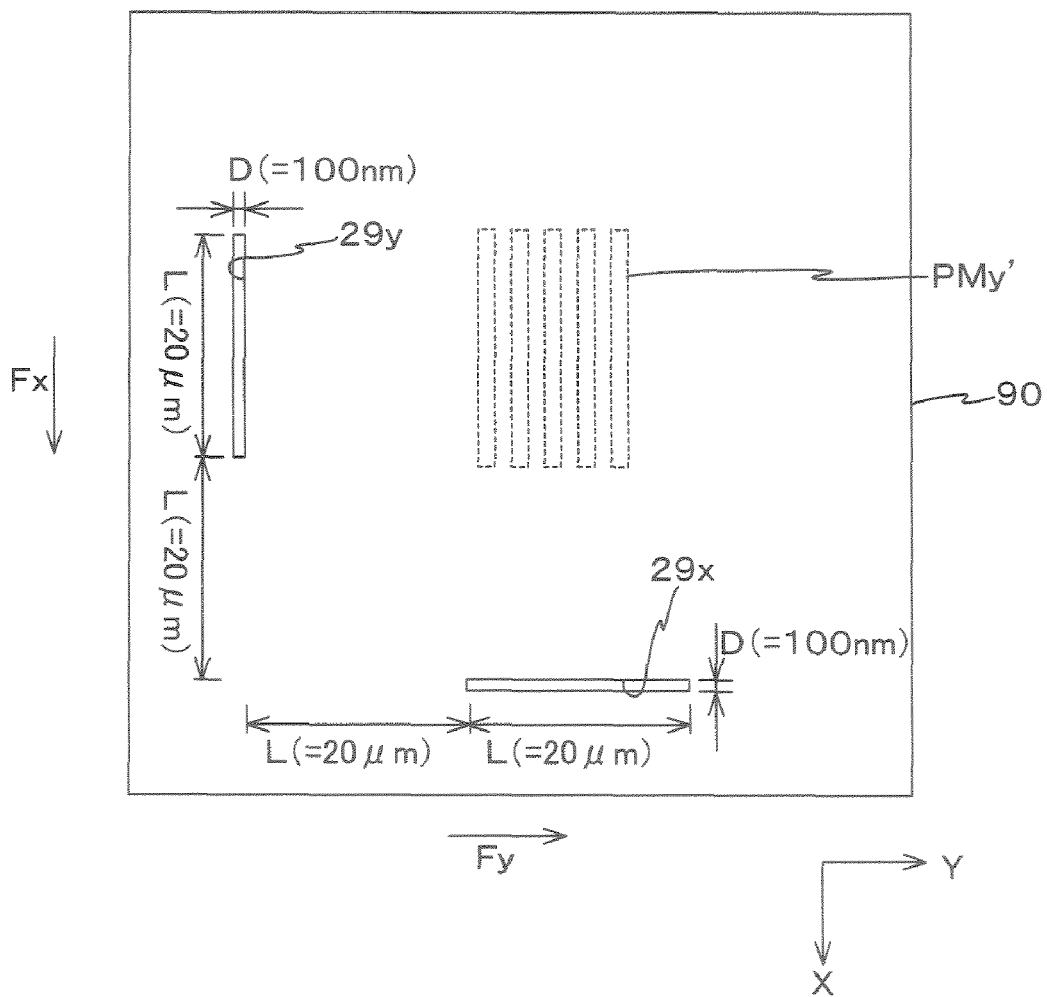
FIG. 3 is a view showing the state where an aerial image PMy' is formed on a slit plate in measuring an aerial image.

Although not shown in FIG. 3, Z-tilt stage 38 is supported by three Z-position drive mechanisms 27 at three points on XY stage 42. In the embodiment, the above-described three Z-position drive mechanisms 27 drive Z-tilt stage 38 in the optical axis AX direction (the Z-axis direction) and the tilted direction with respect to the plane (the XY plane) orthogonal to the optical axis, that is, a θx direction being a rotation direction around the X-axis and θy direction being a rotation direction around the Y-axis. Incidentally, in FIG. 1 wafer stage drive mechanism 56W is shown including the linear motor or the like that drives XY stage 42 and the three Z-position drive mechanisms.

A movable mirror 52W that reflects the laser beam from a wafer laser interferometer (hereinafter, referred to as a "wafer interferometer") 54W is fixed on Z-tilt stage 38, and the position of Z-tilt stage 38 (wafer stage WST) within the XY plane is constantly detected with the resolving power of, for example, about 0.5 to 1 nm by wafer interferometer 54 placed outside.

Herein, in actual, a movable mirror having a reflection surface orthogonal to the Y-axis direction being a scanning direction on scanning exposure and a movable mirror having a reflection surface orthogonal to the X-axis direction being a non-scanning direction are arranged on Z-tilt stage 38, and an X laser interferometer and a Y laser interferometer as the wafer interferometers are arranged corresponding to these movable mirrors. However, in FIG. 1, they are representatively shown by movable mirror 52W and wafer interferometer 54W. Incidentally, for example, a reflection surface (equivalent to the reflection surface of movable mirror 52W) may be formed mirror-polishing the end surface of Z-tilt stage 38. Further, the X laser interferometer and the Y laser interferometer are multiaxial interferometers having a plurality of measuring axes, and can measure a rotation (a yawing (a θz rotation being rotation around the Z-axis), a pitching (a θx rotation being rotation around the X-axis), and a rolling (a θy rotation being rotation around the Y-axis)) in addition to the X and Y-positions of Z-tilt stage 38. Therefore, in the description below, it is assumed that wafer interferometer 54W measures the positions of Z-tilt stage 38 in the directions of five degrees of freedom, i.e. X, Y, θz, θy, and θx. Further, the multiaxial interferometer irradiates a laser beam to a reflection surface installed on a frame (not shown), on which projection optical system PL is mounted, via a reflection surface tilted at 45 degrees arranged on the Z-tilt stage 38, and may detect relative positional information regarding the optical axis direction (the Z-axis direction) of projection optical system PL.

Positional information (or velocity information) of Z-tilt stage 38 (wafer stage WST) is supplied to stage controller 70 and main controller 50 via stage controller 70. Stage controller 70 controls the position of Z-tilt stage 38 (wafer stage WST) within the XY plane via wafer stage drive system 56W in response to instructions of main controller 50.

Figure 2:
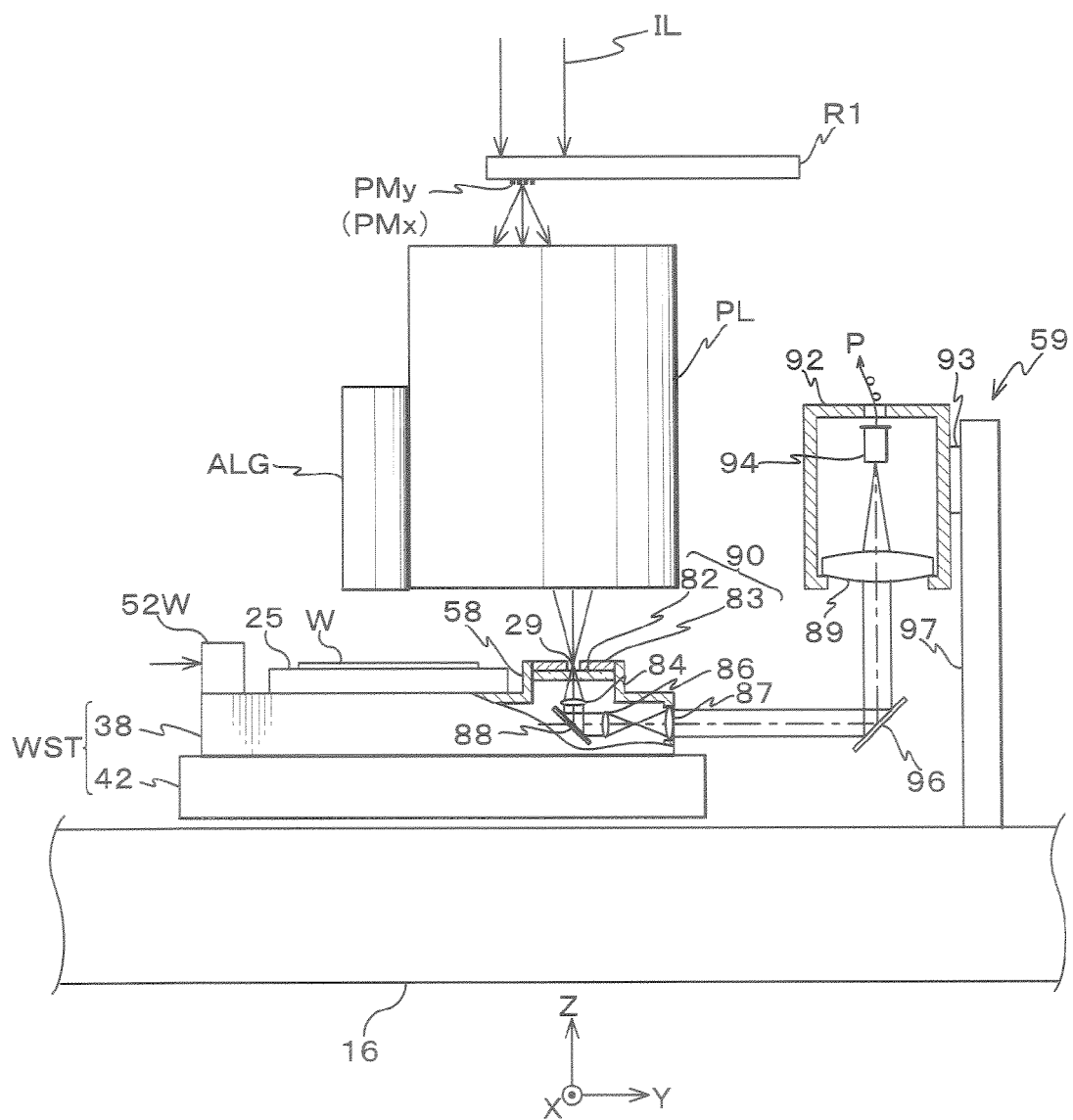
FIG. 2 is a view showing the internal configuration of an aerial image measuring unit in FIG. 1.

Further, a part of an optical system, which constitutes a part of an aerial image measuring unit 59 that is used for measuring the optical characteristics of projection optical system PL, is placed inside Z-tilt stage 38. Herein, the configuration of aerial image measuring unit 59 will be described in detail. As is shown in FIG. 2, aerial image measuring unit 59 is equipped with a stage-side component arranged in Z-tilt stage 38, that is, a slit plate 90 as a pattern plate, a relay optical system that is composed of lenses 84 and 86, a mirror 88 for deflecting the optical path and a light-transmitting lens 87, and an external-stage component arranged outside wafer stage WST, that is, a mirror 96, a light-receiving lens 89, an optical sensor 94 and the like.

Figure 4:
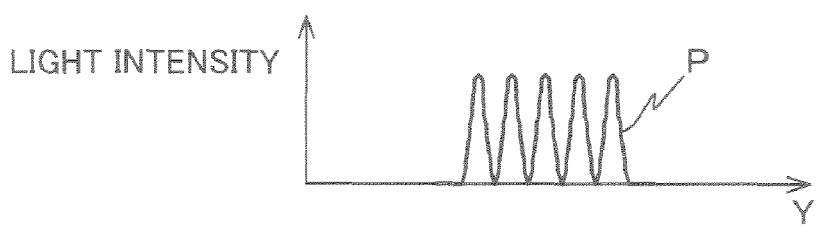
FIG. 4 is a diagram showing an example of a photoelectric conversion signal (light intensity signal) that is obtained in performing aerial image measurement.

More specifically, as is shown in FIG. 4, slit plate 90 is fitted into an opening, which is formed on the top portion of a protruded section 58 arranged on the upper surface of one end portion of wafer stage WST, from above so as to close the opening. On slit plate 90, a reflective film 83 that also serves as a light-shielding film 15 formed on the upper surface of light-receiving glass 82 that is rectangular in a plan view, and a slit-shaped aperture pattern hereinafter, referred to as a "slit") 29 is formed by patterning on a part of reflective film 83. Note that, as is shown in FIG. 3, a slit 29y extending in the X-axis direction with a predetermined width D (e.g. D is 100 nm) and a slit 29x extending in the Y-axis direction with a predetermined width D are actually formed on slit plate 90 in the positional relation (positional relation remote by L in the X-axis direction and Y-axis direction (L is 20 μm, for example)) as shown in FIG. 3. However, in FIG. 2, slits (29x, 29y) are representatively shown as slit 29. The lengths of slits (29x, 29y) are L. Hereinafter, slits (29x, 29y) are generally referred to as slit 29 appropriately. Meanwhile, in this embodiment, the reason of the above-described arrangement and dimension of the slits will be described later.

Herein, slit plate 90 may also serve as at least one of a fiducial mark plate on which fiducial marks used for baseline measurement of an alignment system (to be described later) and other fiducial marks are formed, and a reference reflection plate for performing calibration between sensors of a multipoint focal position detection system (to be described later). Note that it goes without saying that the fiducial mark plate may be arranged separately from slit plate 90. In this embodiment, anti-reflection coating is applied on the surface of reflective film 83 by chromium oxide, for example, and its reflectance is set to about the same as the reflectance of resist.

Inside Z-tilt stage 38 below slit 29, the relay optical system (84, 86) made up of lenses 84 and 86 is placed with a mirror 88, which horizontally deflects the optical path of illumination light IL that has been made incident vertically downward via slit 29, laid between the lenses. Light-transmitting lens 87 that transmits illumination light IL, which has been relayed by a predetermined optical path length by the relay optical system (84, 86), to outside wafer stage WST is fixed on the sidewall on a +Y side of wafer stage WST in the rear of the optical path of the relay optical system (84, 86).

On the optical path of illumination light IL that is sent outside wafer stage WST by light-transmitting lens 87, mirror 96 having a predetermined length in the X-axis direction is arranged tilted at an inclination angle of 45 degrees. Mirror 96 deflects the optical path of illumination light IL sent outside wafer stage WST vertically upward by 90 degrees. Light-receiving lens 89 having a larger diameter than that of light-transmitting lens 87 is placed on the deflected optical path.

Optical sensor 94 is placed above light-receiving lens 89. Light-receiving lens 89 and optical sensor 94 are housed inside a case 92 in a predetermined positional relation, and case 92 is fixed via an attaching member 93 to the vicinity of the upper end portion of a support column 97 that is implanted on the upper surface of base 16.

As optical sensor 94, a photoelectric conversion element (a light-receiving element) that can detect faint light with good accuracy such as a photo-multiplier tube (PMT) is used A photoelectric conversion signal P from optical sensor 94 is sent to main controller 50 via signal processing unit 80 in FIG. 1. Note that signal processing unit 80 can include, for example, an amplifier, a sample holder, an A/D converter (one having 16-bit resolving power is generally used) or the like.

Meanwhile, slit 29 is formed on reflective film 83 as described above, but the description will be made below on the assumption that slit 29 is formed on slit plate 90 for the sake of convenience.

According to aerial image measuring unit 59 having the configuration as described above, on measurement of a projected image (an aerial image) of measurement marks (to be described later) formed on reticle R via projection optical system PL, when illumination light IL having transmitted projection optical system PT illuminates slit plate 90 of aerial image measuring unit 59, illumination light IL having transmitted slit 29 on slit plate 90 is led outside wafer stage WST via lens 84, mirror 88, lens 86 and light-transmitting lens 87. Then, the optical path of illumination light IL led outside wafer stage WST is deflected by mirror 96 vertically upward, the deflected light is received by optical sensor 94 via light-receiving lens 89, and photoelectric conversion signal (light intensity signal) P corresponding to the received light quantity is output from optical sensor 94 to main controller 50 via signal processing unit 80.

In the case of the embodiment, measurement of the projected image (the aerial image) of the measurement marks is performed by a slit scan method, so that light-transmitting lens 87 moves with respect to light-receiving lens 89 and optical sensor 94 on the measurement. Thus, in aerial image measuring unit 59, the sizes of each lens and mirror 96 are set so that all the light via light-transmitting lens 87, which moves within a predetermined range, is made incident on light-receiving lens 89.

As is described above, in aerial image measuring unit 59; slit plate 90, lenses 84 and 86, mirror 88, and light-transmitting lens 87 constitute a light lead-out section that leads Illumination light IL having passed through slit 29 outside wafer stage WST, and light-receiving lens 89 and optical sensor 94 constitute a light-receiving section that receives the light led outside wafer stage WST. In this case, these light lead-out section and light-receiving section are mechanically separated from each other. Then, the light lead-out section and the light-receiving section are optically connected to each other via mirror 96 only when measuring the aerial image.

In other words, in aerial image measuring unit 59, since optical sensor 94 is arranged at a predetermined position outside wafer stage WST, the adverse effect due to heat emission from optical sensor 94, which affects measurement accuracy or the like of wafer interferometer 54W is controlled as much as possible. Further, since the outside and the inside of wafer stage WST are not connected by a light guide or the like, driving accuracy of wafer stage WST does not suffer from adverse effect as in the case the outside and the inside of wafer stage WST are connected by the light guide.

As a matter of course, in the case the influence of heat or the like is negligible or can be eliminated, optical sensor 94 may be arranged inside wafer stage WST. Note that an aerial image measurement method performed by using aerial image measuring unit 59 will be described later in detail.

Referring back to FIG. 1, an off-axis alignment system ALG that detects alignment marks (positioning marks) on wafer W is arranged on the side surface of projection optical system PL. In the embodiment, an alignment sensor by an image processing method, which is a so-called FIA (Field Image Alignment) system, is used as alignment system ALG. A detection signal of alignment system ALG is supplied to main controller 50.

Furthermore, as is shown in FIG. 1, exposure apparatus 10 of the embodiment has a light source whose ON/OFF is controlled by main controller 50, and is equipped with a multipoint focal position detection system by an oblique incident method, which is made up of an irradiation system 60a that irradiates image-forming beams for forming images of a large number of pinholes or slits toward the image-forming plane of projection optical system PL from an oblique direction with respect to optical axis AN, and a photodetection system 60b that receives the reflected beam of the image-forming beams on the surface of wafer W. Note that the detail configuration of a multipoint focal position detection system similar to the multipoint focal position detection system (60a, 60b) of the embodiment is disclosed in, for example, Kokai (Japanese Unexamined Patent Application Publication) No. 6-283403 and the like.

In main controller 50 on scanning exposure or the like (to be described later), in order to make defocus be zero based on a defocus signal from photodetection system 60b, such as for example, an S-curve signal, by controlling the movement in the Z-axis direction and the two-dimensional tilt (i.e. the rotation in the θx and θy directions) of Z-tilt stage 38 via wafer stage drive system 56W, that is, by controlling Z-tilt stage 38 based on the output from the multipoint focal position detection system (60a, 60b) via stage controller 70 and wafer stage drive system 56W, focus leveling control is executed so as to substantially match the image-forming plane of projection optical system PL and the surface of wafer W within exposure area IA (an irradiation area of illumination light IL) conjugate with illumination area IAR.

Moreover, although omitted in FIG. 1, in exposure apparatus 10 of the embodiment, a pair of reticle alignment detection systems, which is made up of a TTR (Through The Reticle) alignment system for simultaneously observing reticle marks on reticle R and their corresponding fiducial marks on the fiducial mark plate via projection optical system PL and uses light having an exposure wavelength, is arranged above reticle R at a predetermined distance in the X-axis direction. As these reticle alignment detection systems, a reticle alignment detection system having a configuration similar to the one disclosed in, for example, Kokai Japanese Unexamined Patent Application Publication) No. 7-176468 and the corresponding U.S. Pat. No. 5,646,413 and the like is used. As long as the national laws in designated states or elected states, to which this international application is applied, permit, the above disclosures of the publication and the U.S. patent are incorporated herein by reference.

The control system mainly consists of main controller 50 composed of a workstation (or microcomputer), and includes a stage controller 70 and the like, which operate under the control of the main controller 50.

Next, aerial image measurement by slit scanning in a horizontal direction (hereinafter, appropriately referred to as "horizontal scanning") using aerial image measuring unit 59 will be described.

FIG. 2 shows the state where aerial images of measurement marks PMy formed on a reticle R1 are being measured using aerial image measuring unit 59. As reticle R1 in FIG. 2, a test reticle exclusively used for aerial image measurement or a device reticle used for manufacturing a device, which is a reticle on which exclusive measurement marks are formed, is used. Instead of these reticles, a reticle fiducial mark plate, which is a fixed mark plate formed on reticle stage RST made of the same glass material as the reticle, having measurement marks formed on the plate, can also be used.

Herein, it is assumed that measurement marks PMy using the X-axis direction as a longitudinal direction and measurement marks PMx using the Y-axis direction as a longitudinal direction are formed at predetermined locations on reticle R1.

Herein, measurement marks PMy and measurement marks PMx may be marks having periodicity in the X-axis direction and the Y-axis direction respectively, and for example, they may be line-and-space (L/S) marks having a duty ratio of 1:1. Further, measurement marks PMy and measurement marks PMx may be placed in proximity.

For example, when measuring the aerial images of measurement marks PMy, main controller 50 drives movable reticle blind 30B shown in FIG. 1 via a blind drive unit (not shown), and the illumination area of illumination light IL is limited in a predetermined area including a measurement marks PMy portion (refer to FIG. 2). In this state, when main controller 50 starts emission of light source 14 and illumination light IL irradiates measurement marks PMy, light (illumination light IL) diffracted and scattered by measurement marks PMy is refracted by projection optical system PL, and aerial images (projected images) of measurement marks PMy are formed on the image plane of projection optical system PL. At this point of time, the position of wafer stage WST is assumed to be set so that aerial images PMy' of measurement marks PMy are formed on a +Y side (or a −Y side) of slit $29y$ on slit plate 90, as shown in FIG. 3.

Then, when stage controller 70 drives wafer stage WST in a +Y direction as indicated by an arrow Fy in FIG. 3 under instructions of main controller 50, slit $29y$ is scanned with respect to aerial images PMy, in the Y-axis direction. During the scanning, the light (illumination light IL) passing through slit $29y$ is received by optical sensor 94 via the photodetection optical system in wafer stage WST, reflective mirror 96 and light-receiving lens 89 outside wafer stage WST, and its photoelectric conversion signal P is supplied to signal processing unit 80 shown in FIG. 1. In signal processing unit 80, predetermined processing is applied to the photoelectric conversion signal to supply a light intensity signal corresponding to aerial images PMy' to main controller 50. Meanwhile, in this occasion, signal processing unit 80 supplies main controller 50 with a signal, which is obtained by normalizing a signal from optical sensor 94 with a signal of integrator sensor 46 shown in FIG. 1 by, for example, division processing, in order to suppress an influence caused by the dispersion of light emission intensity of illumination light IL from light source 14. Main controller 50 obtains an intensity signal (an aerial image profile) of the projected image (the aerial image), by simultaneously loading an output signal from optical sensor 94 input via signal processing unit 80 during the scanning drive, and information on the position in the Y-axis direction (the Y-position) of Z-tilt stage 38 input via stage controller 70 at predetermined sampling intervals.

FIG. 4 shows an example of a photoelectric conversion signal (a light intensity signal) P of the projected image (the aerial image) obtained on the above-described aerial image measurement.

In the case of measuring the aerial images of measurement marks PMx, by setting the position of wafer stage WST so that the aerial images of measurement marks PMx are formed on a +X side (or a −X side) of slit $29x$ on slit plate 90 and driving wafer stage WST in an X direction as indicated by an arrow Fx shown in FIG. 4 to perform measurement similar to the above-described measurement by a slit scanning method, a photoelectric conversion signal (a light intensity signal) corresponding to the aerial images of measurement marks PMx can be obtained.

Next, description will be made for the flare measurement method of projection optical system PL in exposure apparatus 10 of this embodiment but before that, an example of a reticle for measurement RT used in flare measurement will be described based on FIG. 5A and FIG. 5B. Note that the flare generated in a projection optical system is roughly divided into flare caused by front scattering light that is generated on the surface of optical members (lens and the like) constituting the projection optical system or on coating film of the surface in a small angular range, that is, local flare caused by the scattering light on optical member surface, and flare caused by reflection on the coating film of the optical members, that is, global flare caused by the reflection on an optical member surface. Note that the local flare appears on the image plane in the vicinity of the edge on the image of a light-shielding pattern (e.g. a range between several μm and 100 μm), and the global flare spreads outside the local flare (from 100 μm to the entire image plane).

Figure 5A:
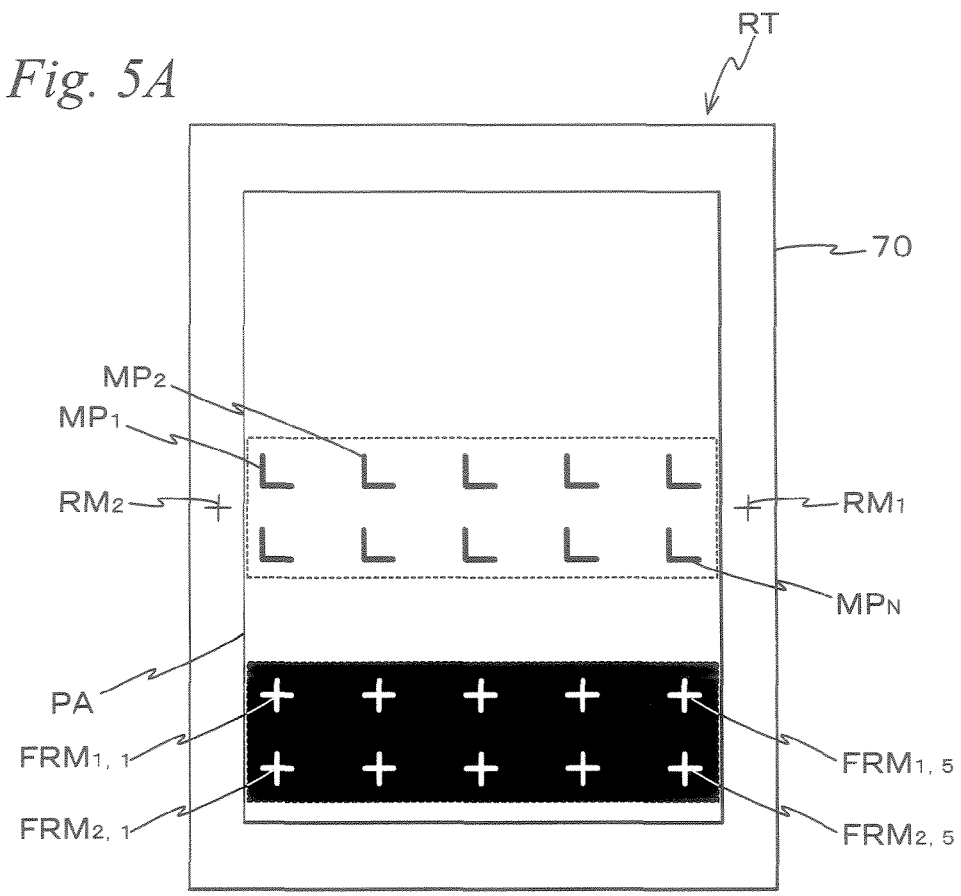
FIG. 5A is a view showing a reticle for measurement used in performing flare measurement.

FIG. 5A shows an example of reticle for measurement RT used in the flare measurement. FIG. 5A is a plan view where reticle for measurement RT is viewed from a pattern surface side (bottom side in FIG. 1. As shown in FIG. 5A, reticle for measurement RT is composed of a rectangular glass substrate 70, and a pattern area PA is formed at the center thereof. Forming areas for two measurement marks are arranged inside pattern area PA.

In other words, inside pattern area PA, a rectangular first mark forming area (area surrounded by dotted line) having substantially the same size as the above-described illumination area IAR, which is located at the central portion thereof, and a rectangular second mark forming area having substantially the same size as the above-described illumination area IAR, which is located in the vicinity of the end portion on one side in the Y-axis direction are arranged.

Inside the first mark forming area, a plurality of flare measurement mark groups $MP_n$ ($MP_1$ to $MP_N$) consisting of chromium or the like are placed in a matrix state of i-rows and j-columns (FIG. 5A shows the case of 2 rows and 5 columns).

Figure 5B:
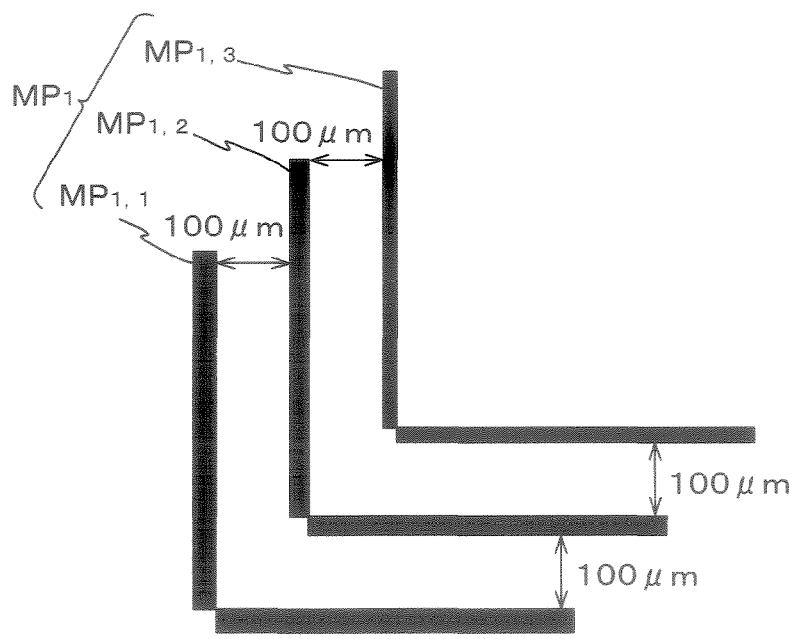
FIG. 5B is a view enlargedly showing one of flare measurement mark groups.
Figure 6:
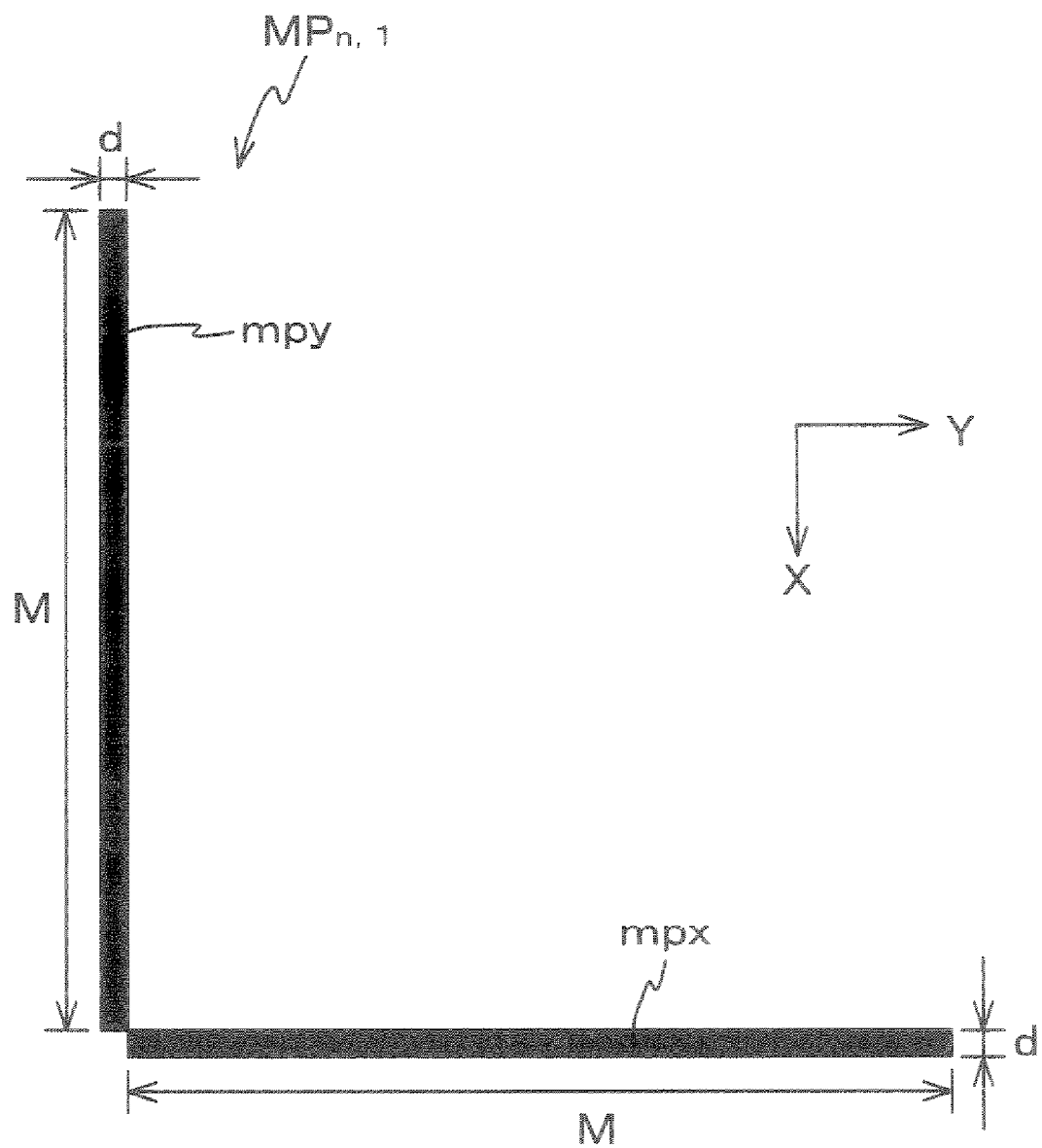
FIG. 6 is a view enlargedly showing one of flare measurement marks in FIG. 5B.

Each of flare measurement mark groups ($MP_1$ to $MP_N$), as flare measurement mark group $MP_1$ is taken out and shown representatively in FIG. 5B, is constituted by a plurality (3 in this case) of rough L-shaped flare measurement marks ($MP_{n,1}$, $MP_{n,2}$, $MP_{n,3}$ ($MP_{1,1}$, $MP_{1,2}$, $MP_{1,3}$ in this case). Of these marks, flare measurement mark $MP_{n,1}$ as shown in FIG. 6, has a first portion mpx composed of a linear light-shielding pattern with a first line width d, which has a predetermined length M (M is 3 L converted on the image plane, that is, 3×20 μm=60 μm) extending in X-axis direction, and a second portion mpy, which is composed of a linear light-shielding pattern of the first line width d having the length M extending in Y-axis direction, placed in a state where a corner portion at one end in its longitudinal direction is in point contact with a corner portion at one end in the longitudinal direction of the first portion mpx.

Further, although each of flare measurement marks ($MP_{n,2}$, $MP_{n,3}$) is composed of the first portion mpx and the second portion mpy similar to flare measurement mark $MP_{n,1}$, a line width of each portion is a second line width and a third line width respectively. Herein, it is assumed that the first line width, the second line width, and the third line width are line widths different from one another.

Note that flare measurement marks ($MP_{n,1}$, $MP_{n,2}$, $MP_{n,3}$) are placed in such a manner that adjacent measurement marks have the spacing of 100 μm in a converted value on the image plane for example, in the X-axis direction and Y-axis direction (refer to FIG. 5B). Herein, the reason why the spacing is set to 100 μm is a result of considering the fact that a spreading range of the local flare is believed to be about 100 μm at the maximum from a pattern edge.

Herein, the reason why the above-described slits ($29x$, $29y$) and each mark of the flare measurement mark groups ($MP_1$ to $MP_n$) were set to the dimensions described above will be briefly described.

Figure 7A:
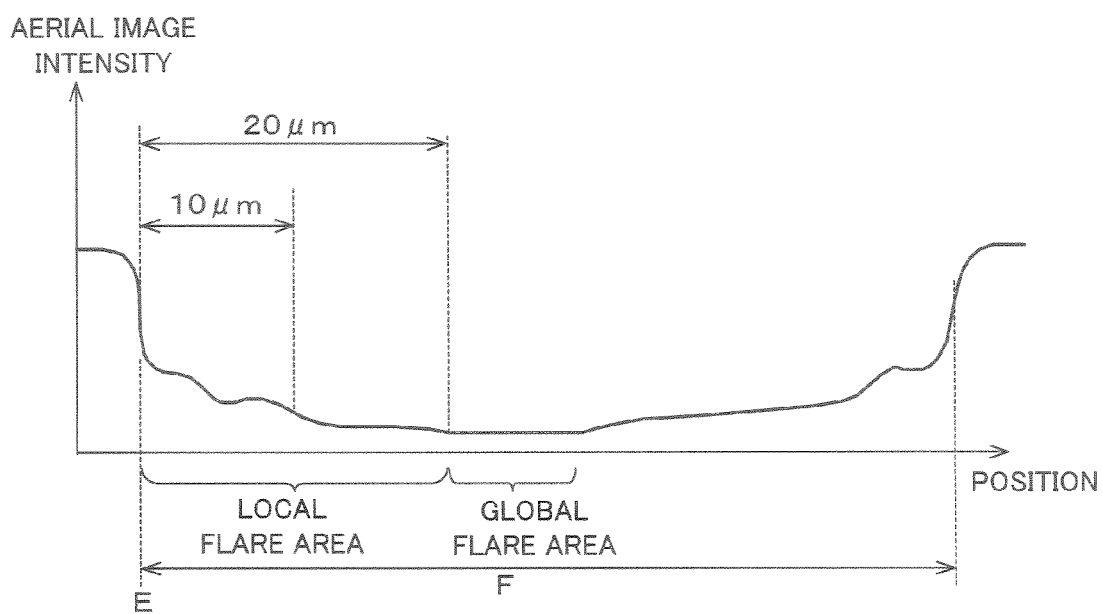
FIG. 7A is a view showing aerial image intensity (light intensity corresponding to an aerial image) being an example of a result of experiment conducted by an inventor.
Figure 7B:
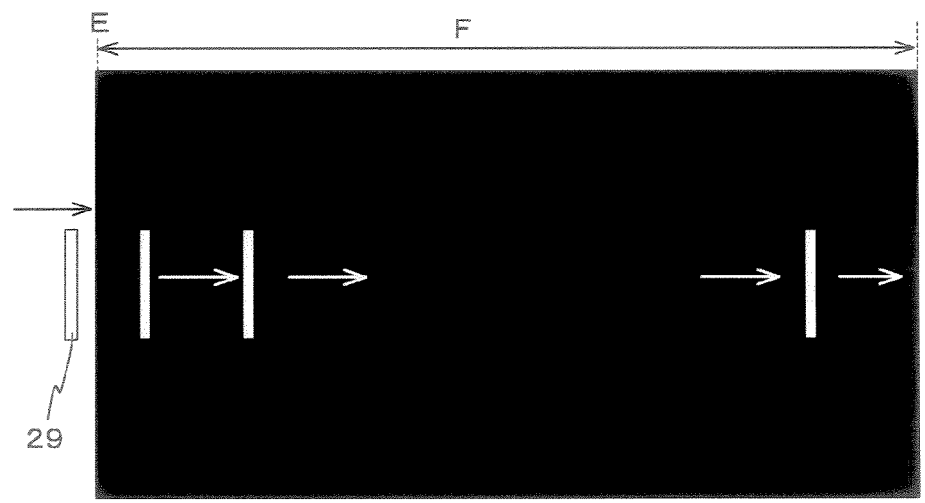
FIG. 7B is a view showing a light-shielding pattern used in the experiment of FIG. 7A.

FIG. 7A shows, as an example of the results of an experiment that the inventor conducted aerial image intensity (light intensity corresponding to aerial image) which is obtained when the aerial image of a rectangular light-shielding pattern having a length in horizontal direction of F as shown in FIG. 7B is measured by the above-described horizontal scanning using aerial image measuring unit 59, while the axis of abscissas is used as a position of slit center in a horizontal scanning direction. As shown in FIG. 7A, it is understood that the aerial image intensity in an area up to about 20 μm from the edge portion E of an image does not become constant due to the influence of the local flare, that is, the area up to 20 μm from the edge portion is influenced by flare from an outside direction.

Figure 8:
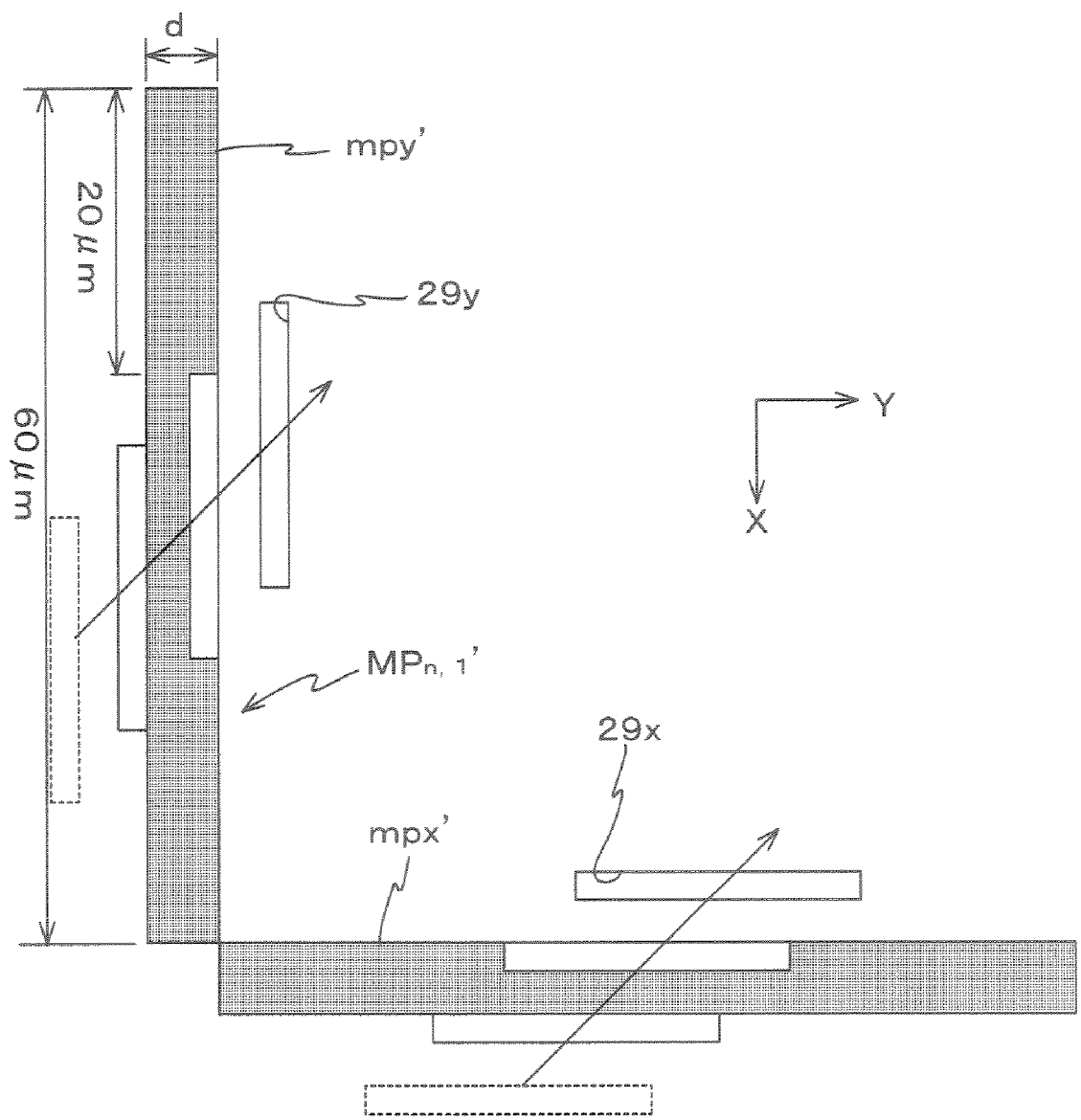
FIG. 8 is a view for explaining flare measurement using a flare measurement mark, and is a view for explaining the dimensions of the flare measurement mark and slits.

On the other hand, in this embodiment, aerial image measurement by horizontal scanning is used in measuring flare such that slits ($29x$, $29y$) are relatively scanned with respect to the image $MP_{n,1}'$ of flare measurement mark $MP_{n,1}$ or example, in a direction crossing X-axis direction and Y-axis direction (e.g. a direction making 45 degrees this embodiment), as shown by the arrows in FIG. 8. Therefore, in performing the measurement, the above-described slits ($29x$, $29y$) and each mark of the flare measurement mark groups ($MP_1$ to $MP_n$) are set to the above-described dimensions in order to allow slits ($29x$, $29y$) to pass positions remote by 20 μm from the edge of the image mpx' of the first portion mpx and the image mpy' of the second portion mpy of flare measurement mark $MP_{n,1}$ in longitudinal direction, as shown in FIG. 8.

Therefore, in this embodiment, based on the light intensity of illumination light IL having transmitted slit $29x$, it is possible to measure the local flare of each flare measurement mark in the X-axis direction (in the first portion mpx) with good accuracy, without being affected by the local flare from the Y-axis direction, that is, the end portion from the longitudinal direction of flare measurement mark mpx. Similarly, based on the light intensity of illumination light IL having transmitted slit $29y$, it is possible to measure the local flare of each flare measurement mark (in the second portion mpy) in the Y-axis direction with good accuracy, without being influenced by the local flare from the Y-axis direction, that is, the end portion from the longitudinal direction of flare measurement mark mpy.

In the second pattern forming area inside pattern area PA of reticle RT, focus evaluation marks (hereinafter, also referred to as evaluation marks) FRM are formed in an arrangement corresponding to flare measurement mark group $MP_n$. In FIG. 5A, 2 rows and 5 columns of evaluation marks ($FRM_{1,1}$ ... $FRM_{1,5}$, $FRM_{2,1}$, ... $FRM_{2,5}$) are formed. Although cross marks are used here as each of evaluation marks ($FRM_{1,1}$, ... $FRM_{1,5}$, $FRM_{2,1}$, ... $FRM_{2,5}$), the marks are not limited to them but may be formed by two line-and-space patterns whose arrangement directions are orthogonal to each other, for example.

Further, on positions bilaterally symmetrical with respect to a linear reticle center in a non-scanning direction, which passes the center on reticle for measurement RT (reticle center), a pair of reticle alignment marks (RM1, RM2) are severally formed as shown in FIG. 5A.

Next, description will be made for the flare measurement of projection optical system PL, which is executed by exposure apparatus 10 of this embodiment, along the flowchart in FIG. 9 in which processing algorithm of a CPU in main controller 50 is shown in a simplified manner and by using other drawings appropriately.

In this case, it is assumed that the flare measurement be performed under M types of (M=4 in this embodiment) illumination conditions that can be set by switching the above-described illumination system aperture stop plate 24, that is, a regular illumination condition (a first illumination condition) set by the regular stop, a small a illumination condition (a second illumination condition) set by the small σ stop, an annular illumination condition (a third illumination condition) set by the annular stop, and quadrupole illumination condition (a fourth illumination condition) set by the SHRINC.

As a premise, calibration of output among a plurality of sensors (photodetectors) that detects surface positional information at each detection point, which constitute multiple point focal position detection systems (60a, 60b), be completed, and each surface positional information that each sensor outputs be accurate. Further, as a premise, a count value m of a first counter that indicates a number of the above-described 4 illumination conditions be Initialized to 1.

Figure 9:
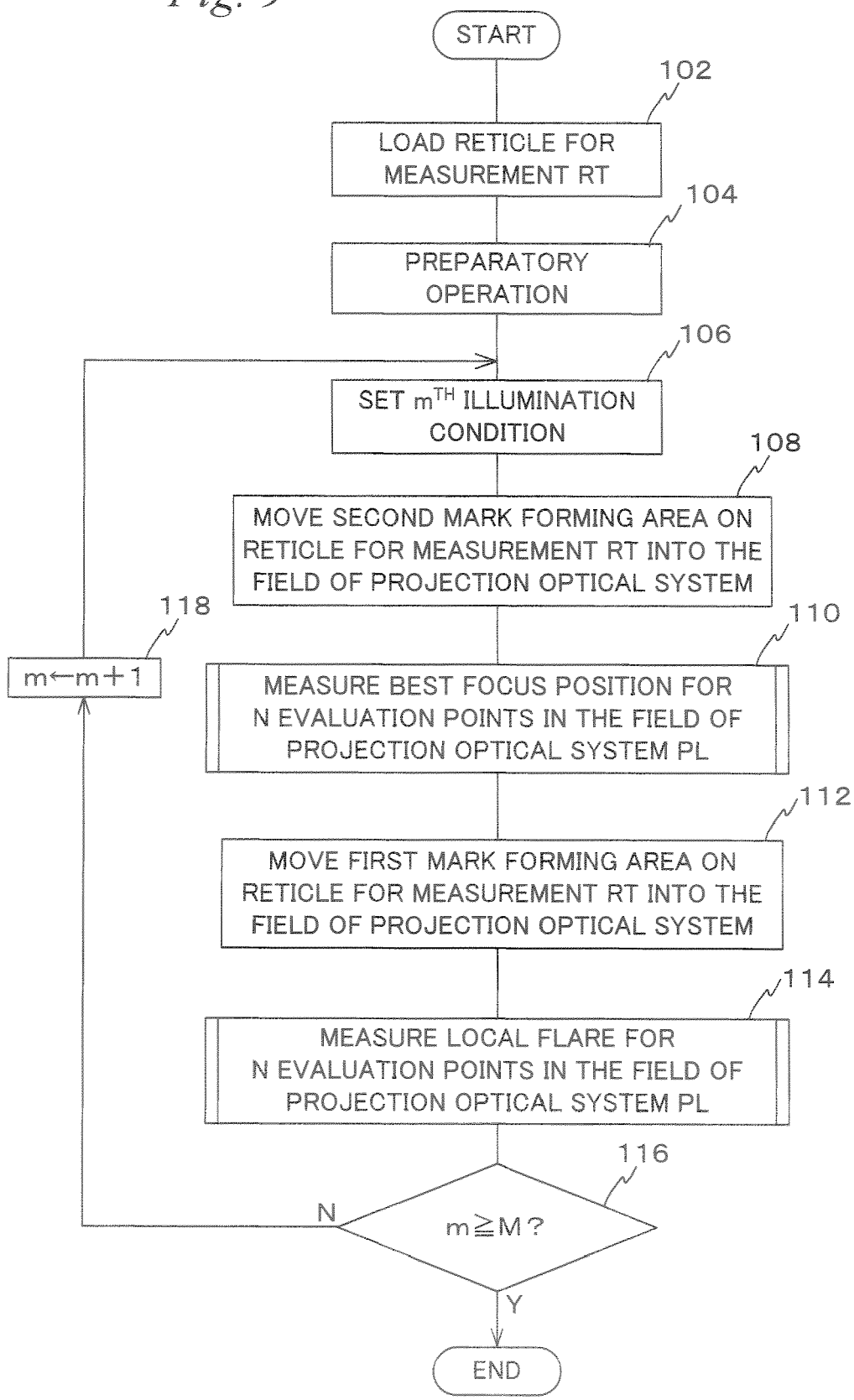
FIG. 9 is a flowchart showing a processing algorithm of a main controller in a simplified manner when performing a flare measurement of a projection optical system, which is executed by the exposure apparatus of an embodiment.

Firstly, reticle for measurement RT is loaded on reticle stage RST via a reticle loader (not shown) in step 102 of FIG. 9.

In the next step 104, predetermined preparatory operation such as the positioning of reticle for measurement RT to projection optical system PL and the setting of a reticle blind is performed. Specifically, wafer stage WST is driven via stage controller 70 and a wafer stage drive mechanism 56W while monitoring a measurement result of wafer interferometer 54W so that a midpoint of a pair of fiducial marks, which is formed on the surface of a fiducial mark plate (not shown) arranged on wafer stage WST, substantially matches an optical axis of projection optical system PL. Next, based on a measurement value of reticle interferometer 54R, reticle stage RST is moved to a position so that the center (reticle center) of reticle for measurement RT substantially matches the optical axis of projection optical system PL via stage controller 70 and reticle stage drive mechanism 56R, and a positional shift between reticle alignment marks (RM1, RM2) and the pair of fiducial marks that individually correspond to them is detected by the above-described reticle alignment detection system (not shown) via projection optical system PL. Thus, as a result, it becomes possible to detect the position of reticle for measurement RT on reticle stage RST with respect to projection optical system PL on a wafer stage coordinate system, which is defined by the measuring axis of wafer interferometer 54W. Meanwhile, it is assumed that the relation between the reticle stage coordinate system and the wafer stage coordinate system, which are defined by the measuring axis of reticle interferometer 54R be known. When the relation between the 2 coordinate systems is used, by driving reticle stage RST based on an output of reticle interferometer 54R, it becomes possible to position reticle R and an arbitrary area of reticle for measurement RT to an effective area (static field) in the field of projection optical system PL. Further, the opening width of movable reticle blind 30B in a non-scanning direction is adjusted so that an illumination area of illumination light IL substantially matches pattern area PA of reticle for measurement RT, for example.

Note that the relation between the above-described 2 coordinate systems can be obtained as a result of reticle alignment of a reticle for devices which was performed when performing exposures for example.

In the next step 106, referring to the count value m of the above-described first counter, an $m^{th}$ illumination condition (the regular illumination condition being the first illumination condition in this case) is set via the above-described illumination system aperture stop plate 24.

In the next step 108, reticle stage RST is driven based on the measurement value of reticle interferometer 54R, and the second mark forming area on reticle for measurement RT is positioned to the effective area in the field of projection optical system PL (area corresponding to the above-described illumination area IAR).

In the next step 110 the procedure moves to a subroutine where the best focus position is measured for N (e.g. 10) evaluation points inside the effective area in the field of projection optical system PL.

Figure 10:
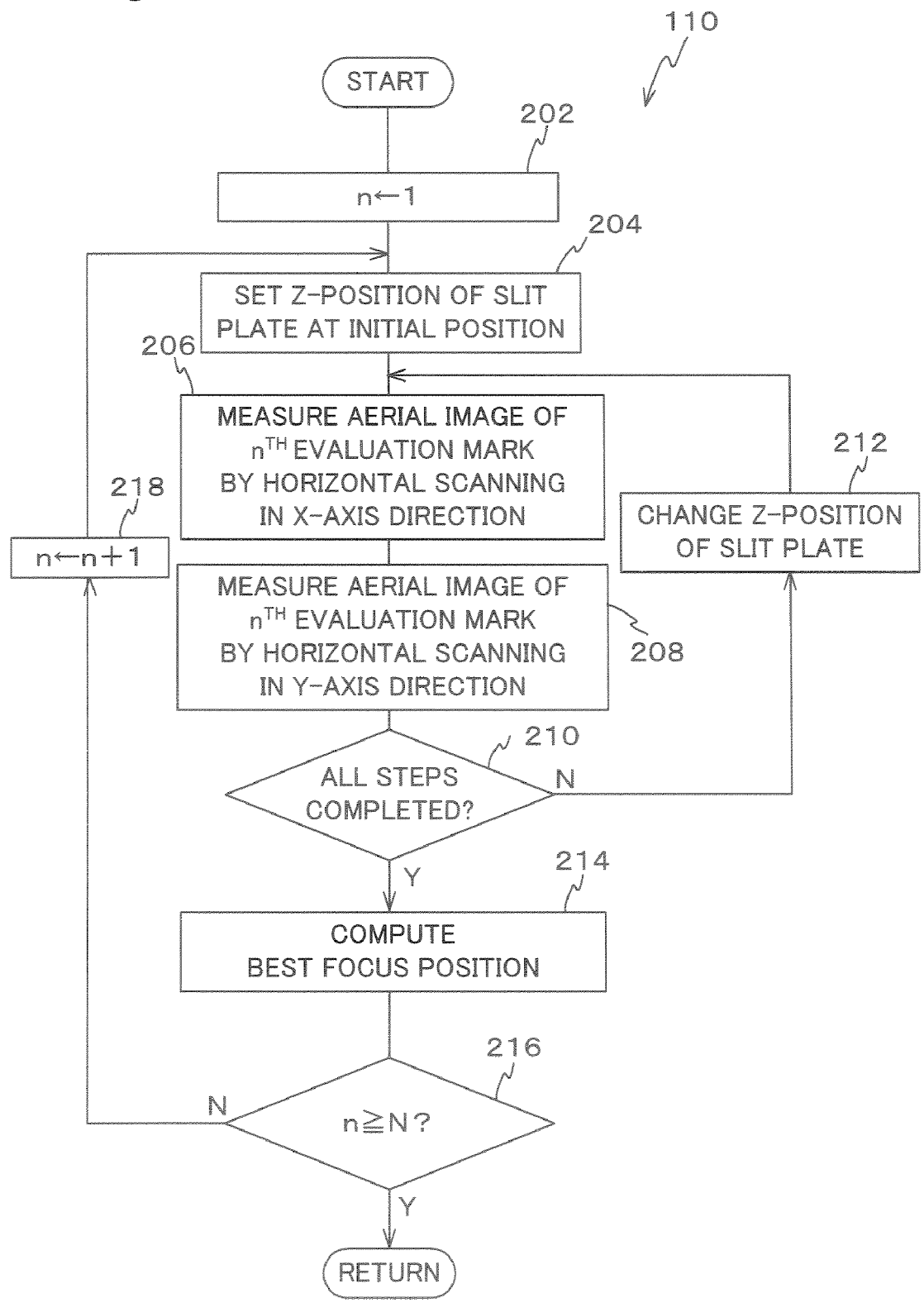
FIG. 10 is a flowchart showing an example of a subroutine 110 in FIG. 9.

In the subroutine of step 110, a count value n of the second counter indicating a number of evaluation points inside the effective area in the field of projection optical system PL in step 202 of FIG. 10 is initialized to 1 (n←1) first.

In the next step 204, in order that a height position of the surface of slit plate 90, that is, a position in the Z-axis direction (hereinafter, simply referred to as a "Z-position") becomes a predetermined initial position, the Z-position of Z-tilt stage 38 is adjusted via stage controller 70. As the "initial position" in this case, for example, a Z-position (a height position) of default setting, for example, a neutral position (an origin position) of the encoder can be employed at the time of starting the exposure apparatus or in the case a previously detected best focus position is deleted due to the initialization of the apparatus or the like, whereas, in the case where data on the detection result of the best focus position performed the last time (a measurement value of the multipoint focal position detection system) is not deleted but stored in a memory 51 or the like, the best focus position, which is the data on detection result, can be employed.

In the next step 206, aerial image (projected image) of the $n^{th}$ evaluation mark (first evaluation mark $FRM_{1,1}$ in this case) is measured by using aerial image measurement unit 59 by horizontal scanning in the X-axis direction, which is similar to the previously described measurement of measurement marks PMx. Accordingly, data of profile (intensity signal waveform where the axis of abscissas is used as the X-position) of a projected image (an aerial image) of the $n^{th}$ evaluation mark (first evaluation mark $FRM_{1,1}$ in this case) is obtained.

In the next step 208 aerial image (projected image) of the $n^{th}$ evaluation mark (first evaluation mark $FRM_{1,1}$ in this case) is measured by using aerial image measurement unit 59 by horizontal scanning in the Y-axis direction, which is similar to the previously described measurement of measurement marks PMy. Thus, data of profile (intensity signal waveform where the axis of abscissas is used as the Y-position) of a projected image (an aerial image) of the $n^{th}$ evaluation mark (first evaluation mark $FRM_{1,1}$ in this case) is obtained.

In the next step 210, the judgment is made of whether or not the Z-position of slit plate 90 has been changed for a predetermined number of steps (to be 15 steps in this case) and aerial image measurement has been performed. Herein, since aerial image measurement has been only performed to the initial position of slit plate 90, the judgment in step 210 is denied and the procedure moves to step 212, in which the Z-position of slit plate 90 is changed according to a predetermined procedure, and then the procedure returns to step 206.

Herein, the setting and the changes of the Z-position of slit plate 90 in step 212 described above are performed based on the surface positional information at a detection point of multipoint focal position detection systems (60a, 60b) in the vicinity of the image-forming point of the image of the $n^{th}$ evaluation point (that is, the first evaluation mark $FRM_{1,1}$ in this case). The order of the settings and the changes of the Z-position of slit plate 90 may be arbitrary.

After that, the loop processing of steps 206→208→210→212→206 is repeated until the judgment in step 210 is affirmed.

In this manner, the procedure moves to step 214 when judgment in step 210 is affirmed. At this point of time, regarding the $n^{th}$ evaluation mark (the first evaluation mark $FRM_{1,1}$ in this case), the intensity signal (the aerial image profile) of an aerial image by X-axis direction horizontal scanning and the intensity signal (the aerial image profile) of an aerial image by Y-axis direction scanning are obtained with respect to each of Z-positions of 15 steps.

In step 214, based on the intensity signals of a total of 30 aerial images regarding the $n^{th}$ evaluation mark (the first evaluation mark $FRM_{1,1}$ in this case), the best focus position of the $n^{th}$ evaluation mark (first evaluation mark $FRM_{1,1}$ in this case) is computed as described in a. to c. below.

a. 15 contrast values of intensity signal by horizontal scanning in the X-axis direction, which have been obtained with respect to each Z-position (each optical axis direction position) of slit plate 90, are computed function fitting is applied to the contrast values by the least-squares method to obtain a contrast curve (a relation between contrast and focus position), and a best focus position $Z_{nx}$ (a focus position having the maximum contrast) in the case when the $n^{th}$ evaluation mark (first evaluation mark $FRM_{1,1}$ in this case) is treated as an X mark is computed based on the peak point of the contrast curve.

b. Similarly 15 contrast values of intensity signal by horizontal scanning in the Y-axis direction, which have been obtained with respect to each Z-position (each optical axis direction position) of slit plate 90, are computed, function fitting is applied to the contrast values by the least-squares method to obtain a contrast curve, and a best focus position $Z_{ny}$ in the case when the $n^{th}$ evaluation mark (the first evaluation mark $FRM_{1,1}$ in this case) is treated as a Y mark is computed based on the peak point of the contrast curve.

c. Next, the average value $(Z_{nx}+Z_{ny})/2$ of best focus positions $Z_{nx}$ and $Z_{ny}$ is used as a best focus position (a best mageforming plane position) $Zbest_n$ at the $n^{th}$ evaluation point corresponding to the $n^{th}$ evaluation mark (the first evaluation mark $FRM_{1,1}$ in this case) on reticle for measurement RT. As a matter of course, the $Zbest_n$ is the measurement value (i.e. an offset value from a detection origin that has been set) of the sensor of the multipoint focal position detection systems (60a, 60b) that detect a Z-position of the surface of a detection subject at a detection point closest to the image of the $n^{th}$ evaluation mark (the first evaluation mark $FRM_{1,1}$ in this case).

Note that in some exposure processes where the exposure apparatus is used, a pattern in which longitudinal direction is parallel with either the X-axis direction or the Y-axis direction becomes particularly important. Therefore, when performing the above-described averaging processing of $Z_{nx}$ and $Z_{ny}$ for computing the best focus position $Zbest_n$, the averaging processing can be performed by weighting the best focus position of a pattern in an important direction.

In the next step 214, whether or not detection processing of evaluation marks has ended for N evaluation points in the field of the projection optical system (corresponding N evaluation marks) is judged by judging whether or not the count value n of the previously described second counter is a total number N of evaluation points (in this embodiment, it is set to N=10 as an example) or more. Since only processing for first evaluation mark $FRM_{1,1}$ has ended in this case, the Judgment is denied, and the procedure moves to step 218 in which the count value n of the second counter is incremented by 1 (n←n+1). Then, the procedure returns to step 204, and afterward the foregoing processing of step 204 and the subsequent steps is repeated until the Judgment in step 216 is affirmed.

Thus, regarding each of $2^{nd}$ to $10^{th}$ ($n^{th}$) evaluation marks $FRM_{1,2}, FRM_{1,3}, \ldots, FRM_{1,5}, FRM_{2,5}, FRM_{2,4}, FRM_{2,1}$, the measurement of an aerial image (obtaining an intensity signal (an aerial image profile) of a projected image (an aerial image)) by horizontal scanning in the X-axis direction and horizontal scanning in the Y-axis direction, and the computation of best focus positions $Zbest_2$ to $Zbest_{10}$ on $2^{nd}$ to $10^{th}$ ($n^{th}$) evaluation points in the field of projection optical system PL corresponding to each evaluation mark is performed in 15 steps of Z-positions.

Then, when the judgement in step 216 is affirmed, the processing of the subroutine where the best focus positions are measured ends and the procedure returns to step 112 of the main routine in FIG. 9.

Meanwhile, a measurement method of the best focus position is not limited to the above-described method, and the best focus position can be measured by scanning slit plate 90 in an X-axis (or Y-axis) direction to the projected image (aerial image) of the evaluation marks by projection optical system PL while illuminating the evaluation marks by illumination light IL, receiving the illumination light via slit 29 during the scanning, and detecting the positional information of the projected image of evaluation marks in the X-axis (or Y-axis) direction, and also based on the detection results, by scanning slit plate 90 in the Z-axis direction while illumination the evaluation mark by illumination light IL in a state where slit plate 90 is positioned within the XY plane and obtaining position data and intensity data of the illumination light having transmitted the slit at a predetermined sampling interval, from these data, the best focus position of projection optical system PL can be computed.

In step 112, reticle stage RST is moved based on a measurement value of reticle interferometer 54R, and a first mark forming area on reticle for measurement RT is positioned on the effective area in the field of projection optical system PL (area corresponding to illumination area IAR described above). When moving reticle stage RST in step 112, the displacement of reticle for measurement RT with respect to the projection optical system PL in the optical axis direction is to be negligibly small. Therefore, Z-positions on the pattern surface of reticle for measurement RT, which correspond to the same evaluation point in the field of projection optical system PL, before and after the movement are equal with each other. In other words, Z-position of each of $1^{st}$ to $10^{th}$ ($n^{th}$) evaluation marks ($FRM_{1,1}, FRM_{1,2}, \ldots FRM_{1,5}, FRM_{2,5}, FRM_{2,4}, \ldots, FRM_{2,1}$) in the state before starting movement and Z-position of each of $MP_1, MP_2, \ldots MP_5, MP_{10}(MP_N), MP_9, \ldots MP_6$ in the state after the movement substantially matches.

In the next step 114, the procedure moves to a subroutine where the local flare is measured regarding N (e.g. 10) evaluation points inside the effective area in the field of projection optical system PL.

Figure 11:
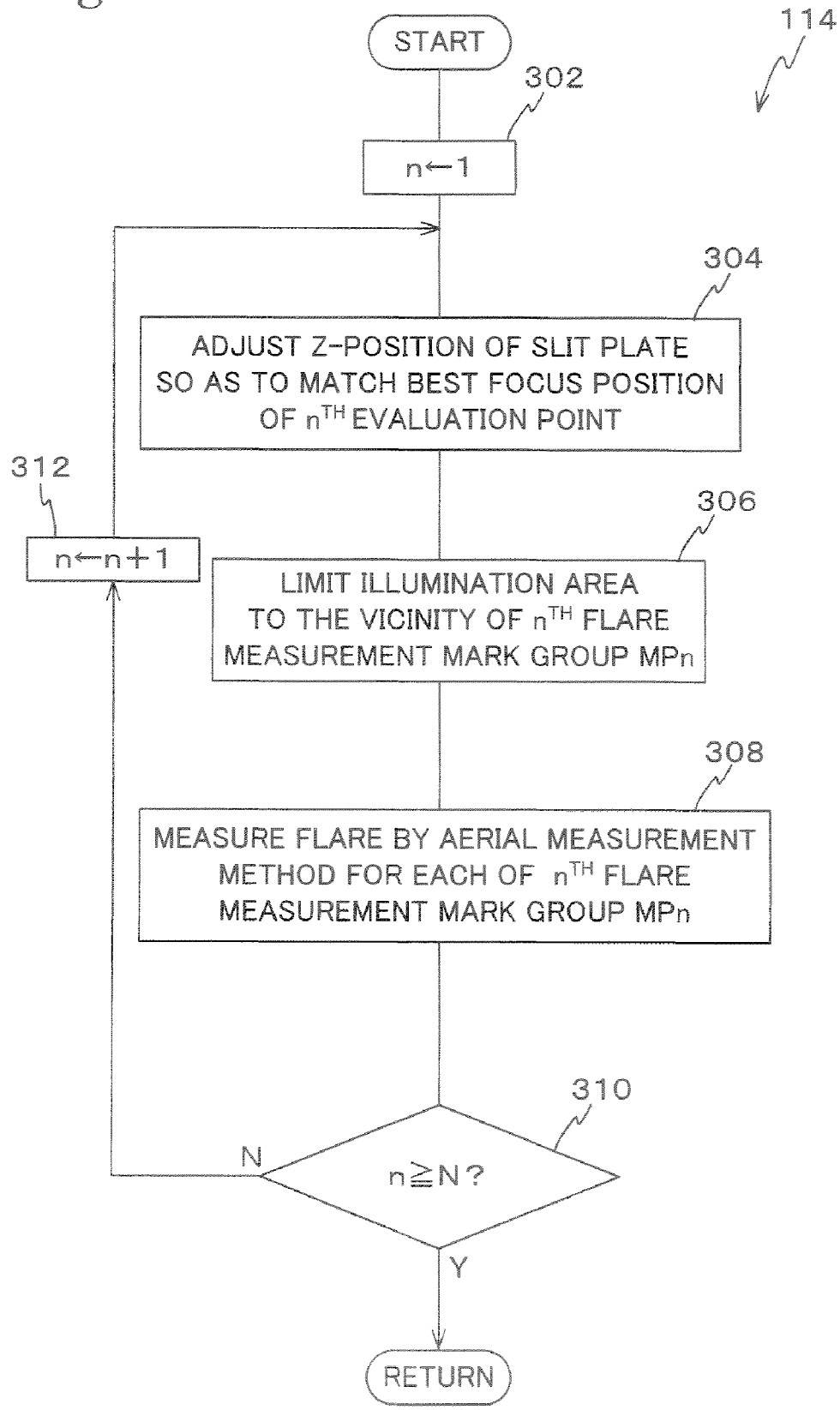
FIG. 11 is a flowchart showing an example of a subroutine 114 in FIG. 9.

In subroutine 114, the count value n of the second counter described above is initialized to 1 (n←1) first in step 302 of FIG. 11.

In the next step 304, Z-position of slit plate 90 is adjusted so as to match the best focus position of $n^{th}$ ($1^{st}$ in this case) evaluation point inside the effective area in the field of projection optical system PL, which was previously measured in step 110.

In the next step 306, movable reticle blind 30B is driven to limit the illumination area in order to allow illumination light IL to be irradiated only on the vicinity of $n^{th}$ flare measurement mark group $MP_n$ ($MP_1$ in this case) that is located on the above-described $n^{th}$ ($1^{st}$ in this case) evaluation point.

In the next step 308, measurement of flare by an aerial image measurement method is executed for at least one of each mark ($MP_{1,1}, MP_{1,2}, MP_{1,3}$) of $n^{th}$ ($1^{st}$ in this case) flare measurement mark group $MP_n$ (=$MP_1$).

For example, when performing flare measurement regarding the widest flare measurement mark $MP_{n,1}$ (flare measurement mark $MP_{1,1}$ in this case because n=1) of $n^{th}$ ($1^{st}$ in this case) flare measurement mark group $MP_n$ (=$MP_1$), the following A to C are performed.

A. First, main controller 50 drives wafer stage WST based on a measurement value of wafer interferometer 54W via stage controller 70 and wafer stage drive mechanism 56W, and moves wafer stage WST to a measurement starting position of flare measurement mark $MP_{n,1}$ (a position where slits (29x, 29y) are located shown by dotted line in FIG. 8).

Figure 12:
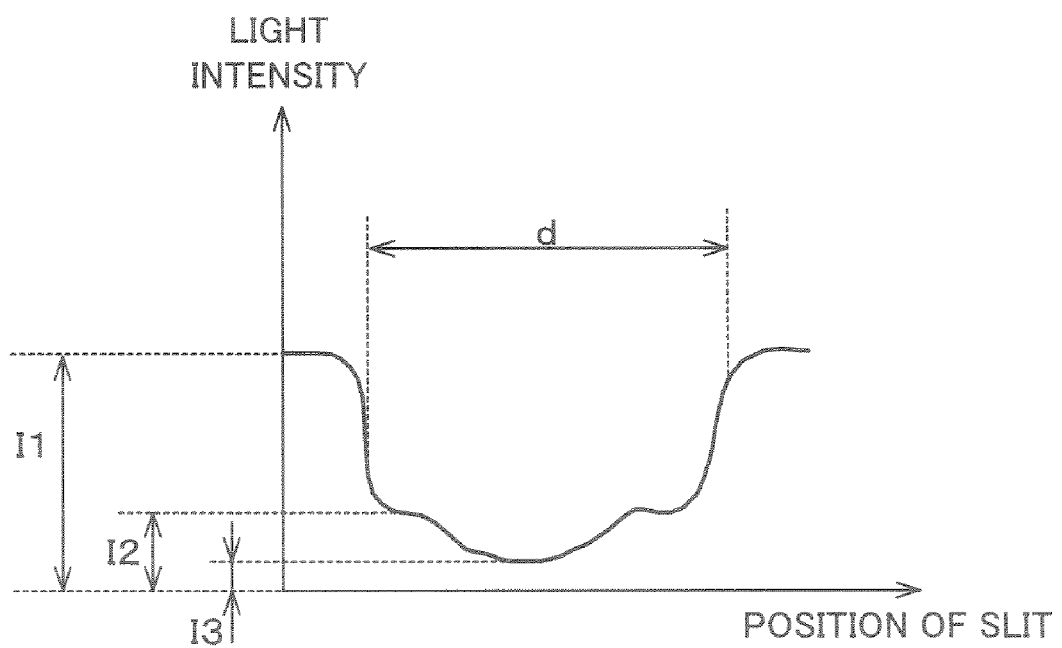
FIG. 12 is a diagram showing an example of a photoelectric conversion signal (light intensity signal) that is obtained in performing flare measurement.

B. From this state, main controller 50, while scanning wafer stage WST in a direction inclined by 45 degrees to the X-axis and the Y-axis in the state where the vicinity of flare measurement mark $MP_{n,1}$ on reticle for measurement RT is illuminated with illumination light IL, measures a projected image $MP_{n,1}$ of flare measurement mark $MP_{n,1}$, which was formed by projection optical system PL, by a horizontal scanning method as shown in FIG. 8 by using aerial image measuring unit 59. Thus, optical sensor 94 receives illumination light IL having passed through projection optical system PL, and main controller 50 obtains light intensity distribution as shown in FIG. 12. In FIG. 12, the axis of abscissas is the positions of slits (29x, 29y) regarding a measurement direction (a direction orthogonal to the longitudinal direction of image (mpx' or mpy')), and the axis of ordinate is light intensity measured by optical sensor 94.

Herein, as it is understood from FIG. 5, in this embodiment, measurement equivalent to the case where a first aerial image measurement (loading of light intensity signal) by X-axis direction horizontal scanning of slit 29x to image mpx' and a second aerial image measurement (loading of light intensity signal) by Y-axis direction horizontal scanning of slit 29x to image mpy' are simultaneously performed is executed as flare measurement concerning flare measurement mark $MP_{n,1}$, and a light intensity signal in which the light intensity signal of image mpx' and the light intensity signal of image mpy' are added is obtained as the measurement result. Therefore, a light intensity signal with good S/N ratio can be obtained, comparing to a case where the first aerial image measurement or the second aerial image measurement is performed.

C. Next, main controller 50 computes a contrast value C1 as an index of flare based on the obtained light intensity signal by using the following equation (1).

$$C1 = I0/I1 \qquad (1)$$

Herein, I1 denotes the maximum value (reference value, of detected light intensity and I0 denotes a value of light intensity at a point where flare quantity needs to be obtained. For example, regarding a representative index value (a value corresponding to the above-described contrast value C) of a portion having line width d, the minimum value I3 of the detected light intensity should be substituted for I0 in the above equation (1) so as to compute C1=I3/I1.

Since contrast value C1 to be computed in this case is a contrast value concerning flare in a one-dimensional direction, a contrast value being an index value of flare in a two-dimensional direction may be computed by doubling the value, for example.

Figure 17:
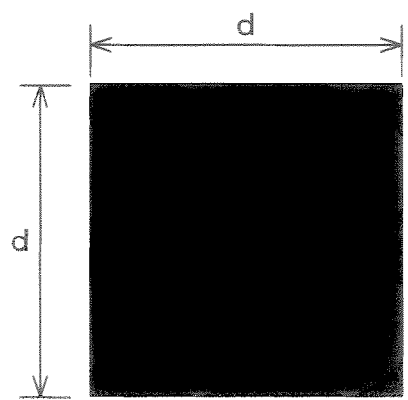
FIG. 17 is a view for explaining a conventional art.

It is possible to consider that the contrast value 2×C1 substantially matches contrast value C by the above-described exposing method in the case of transferring a predetermined mark whose one side is d as shown in FIG. 17 onto the wafer.

Meanwhile, in the description above, contrast value C1 could be converted to contrast value C by the exposing method by simply doubling contrast value C1, but for example, by calculating contrast value C is severally in advance for various squares patterns having different lengths d of one side by using the above-described exposing method, by similarly calculating contrast value C1 for various flare measurement marks having different line widths d, and from the relation between contrast value C and contrast value C1 corresponding to the same d, a conversion equation shown in the following equation (2), in which contrast value C1 is converted into a contrast value by the exposing method, may be computed $$\text{Contrast value by the exposing method}=f(C1) \quad (2)$$

Then, when contrast value C1 was obtained a contrast value by the exposing method may be computed by using the equation (2).

In this embodiment, since flare measurement mark group $MP_n$ is constituted by a plurality of flare measurement marks ($MP_{n,1}$, $MP_{n,2}$, $MP_{n,3}$) that are arrayed in a direction inclined by 45 degrees with respect to X-axis and Y-axis, flare measurement can be performed concerning flare measurement marks ($MP_{n,1}$, $MP_{n,2}$, $MP_{n,3}$) by one horizontal scanning action, and contrast value C1 (or its converted value) of each flare measurement mark ($MP_{n,1}$, $MP_{n,2}$, $MP_{n,3}$) can be obtained.

Returning to FIG. 11, in the next step 310, whether or not flare measurement has ended for all flare measurement mark groups is judged by judging whether or not the count value n of the second counter is the total number N of flare measurement mark groups (evaluation points) or more. In this case, n=1 holds and flare measurement only ended for the first flare measurement mark group $MP_1$, the judgment here is denied, the procedure moves to step 312 in which the count value n of the second counter is incremented by 1 (n←n+1), and then, returns to step 304. Afterward, until the judgment in step 310 is affirmed, loop processing of step 304→306→308→310→312→304 is repeatedly performed. Thus, regarding $2^{nd}$ to $n^{th}(10^{th})$ evaluation points, in the state where the slit plate is set to their best focus positions, flare measurement by the method of aerial image measurement by the above-described horizontal scanning is performed for $2^{nd}$ to $n^{th}$ ($10^{th}$) flare measurement mark groups ($MP_2$ to $MP_N$), and contrast value C1 (or its converted value) is computed.

Then, when flare measurement and computation of contrast value C1 (or its converted value) for $N^{th}$ ($10^{th}$) flare measurement mark group $MP_N$ end, and judgment in step 310 is affirmed, the processing of subroutine 114 ends, and the procedure returns to step 116 of main routine in FIG. 9.

In step 116, whether or not flare measurement has ended under all illumination conditions is judged by judging whether or not the count value m of the above-described first counter is the total number M (4 in this case) or more of illumination conditions that can be set. In this case, since flare measurement ended only under the first illumination condition, that is, the normal illumination condition, judgment in this case is denied and the procedure moves to step 118 in which the count value m of the first counter is incremented by 1 (m←m+1), and then, the processing of the above-described step 106 and succeeding steps is repeated until judgment in step 116 is affirmed. Thus, flare measurement is sequentially performed under each of the second illumination condition (small σ illumination condition set by the small σ stop), the third illumination condition (annular illumination condition set by the annular stop), the fourth illumination condition (quadrupole illumination condition set by the SHRINC).

In this manner, when flare measurement ends under the $M^{th}$ illumination condition, judgment in step 116 is affirmed, and a series of processing of this routine ends.

Note that contrast value C1 (or its converted value) obtained by the above-described flare measurement should be referred to as "flare information" hereinafter.

Figure 13:
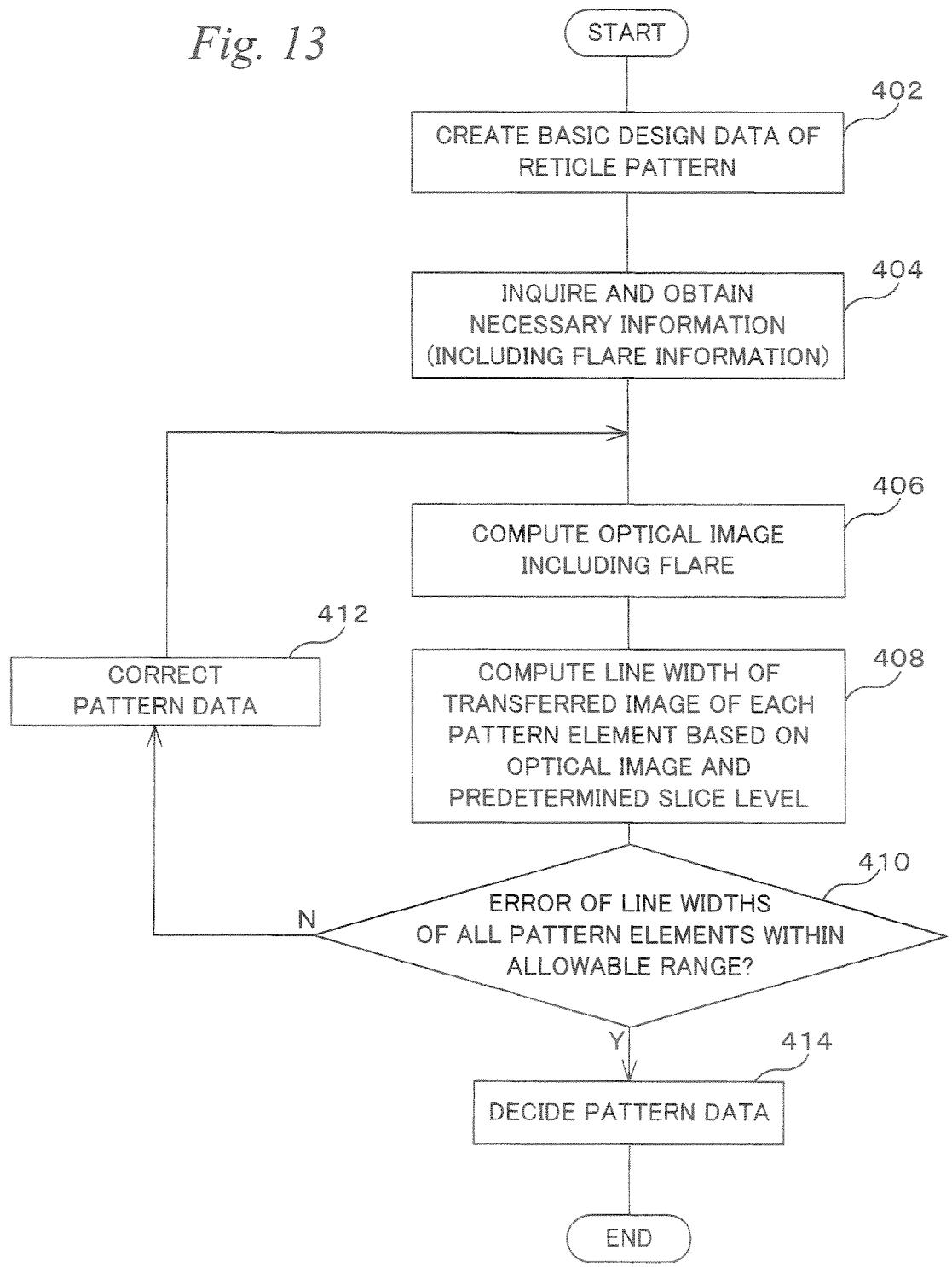
FIG. 13 is a flowchart showing a creating processing algorithm of reticle pattern data, which should be formed on a working reticle to be manufactured, by a reticle design system.

Next, description will be made for a creating processing of a reticle pattern data to be formed on a working reticle (reticle R used in exposure apparatus 10), in which the flare information is taken in consideration and correction of line width information in reticle pattern data is included, along the flowchart in FIG. 13 showing processing algorithm of a computer (CPU inside) that constitutes a reticle design system (not shown).

Herein, it is assumed that a reticle design system be connected to main controller 50 of exposure apparatus 10 via LAN or the Internet (hereinafter, referred to as "LAN or the like" for the convenience of explanation).

Processing algorithm of FIG. 13 starts when information including a partial design data of a pattern to be formed on the working reticle to be manufactured is inputted from a plurality of terminals for design (not shown) to the computer via LAN or the like.

First, in step 402, in response to the input of the information the computer creates basic design data of one reticle pattern in which all of partial design data is integrated.

In the next step 404, a basic design data of the pattern of the working reticle, which has been created is sent to main controller 50 of exposure apparatus 10 via LAN or the like, and necessary information including information of the exposure condition of exposure apparatus 10 (including information such as target illumination condition, target dose (proper exposure quantity corresponding to resist sensitivity), NA used in the projection optical system), the above-described flare information in a large number of evaluation points in the effective field of the protection optical system (flare information concerning each of flare measurement marks having different line widths under the above-described plurality of illumination conditions) and the like is inquired and obtained. At this point, in a subject equipment (exposure apparatus) 10, flare information of a large number of evaluation points in the effective field of projection optical system PL is to be previously measured in advance, and its measurement result is to be stored inside the memory 51 that is connected to main controller 50.

Thus, together with the information of exposure condition of the subject equipment (including information such as target illumination condition, target dose, NA used in the projection optical system), flare information at a large number of measurement points is sent from main controller 50 to the computer of the reticle design system.

Then, in the next step 406 and subsequent step, based on obtained flare information and distribution shape (shape of light-dark distribution) data of pattern, which is obtained from the design data created in step 402 above, that is, transmittance distribution function, a correction value of the line width of each pattern element, which constitutes a reticle pattern, is computed.

Specifically, a transmittance distribution function in the design data of reticle pattern and flare information are used in step 406, predetermined operation processing (e.g. computation processing of point image intensity distribution function including flare based on flare information, and two-dimensional convolution operation processing between the point image intensity distribution function and the transmittance distribution function, or the like) is performed, and image intensity distribution (hereinafter, referred to as an "optical image") in an optical image including flare formed on the image plane of projection optical system PL is computed.

In the next step 408, the optical image computed in step 406 above is sliced at a predetermined slice level and the line width of a transferred image of each pattern element is computed.

In the next step 410, whether or not an error of the line width of a transferred image of each pattern element, which was computed in step 408 above (hereinafter, referred to as a "line width error"), to the line width on design is within an allowable range for all pattern elements is judged. Then, in the case where judgment in step 410 is affirmed, in other words in the case where the line width error of the transferred image of all pattern elements is within the allowable range, the procedure moves to step 414 in which pattern data that is set at that time is decided as final reticle pattern data and stored in the memory, and then, a series of processing of this routine ends.

On the other hand, in the case where judgment in step 410 above is denied, in other words, when the line width error of at least one pattern element whether or not flare measurement has ended under all illumination conditions is Judged is outside the allowable range, procedure moves to step 412 in which the pattern data is corrected (or changed) to allow the transfer line width of each pattern element, which was outside the allowable range to approach a desired line width, that is, a designed line width.

In performing the correction processing of the pattern data in step 412, the designed line width is subtracted from a line width of the transferred image of a pattern element to be corrected, which was computed in step 408, a line width on design of the pattern element is made narrower when the difference value is positive, and on the contrary, the line width on design of the pattern element is made thicker when the difference value is negative. In any case, correction (change) of line width is performed by shifting a pattern edge of a reticle pattern on design data (boundary between a transmissive portion and light-shielding portion on data) in a perpendicular direction to the edge by a predetermined amount (a predetermined grid), for example.

The procedure returns to step 406 after the correction (or change) of the above-described pattern data, and afterward, the loop processing of step 406→408→410→412 is repeated until the judgment in step 410 is affirmed. Thus, computation of optical image including flare to the shape of pattern data after the correction (transmittance distribution function) and computation of the line width of a transferred image of each pattern element corresponding to the optical image are repeatedly performed at least for one time, the procedure moves to step 414 when transfer line widths of all pattern elements fall in the allowable range, the pattern data set at that time is decided as the final reticle pattern data, and it is stored in the memory.

After that, the created reticle pattern data is sent from the computer of a pattern design system to a computer of a pattern forming system (not shown) via LAN or the like in the manner described above. Then, the computer of the pattern forming system, based on the information of the design data of the reticle pattern, which has been sent, draws the reticle pattern on a reticle blanks on which the electron beam resist is coated by using an EB drawing unit (not shown).

In this manner, the reticle blanks on which the reticle pattern has been drawn is severally developed by a C/D, and when the electron beam resist is a positive tape, for example, a resist pattern of an area, on which electron beam is not irradiated, is left as a original plate pattern.

After that, the substrate (reticle blanks) after the development is carried to an etching section (not shown) and etching is performed by using a residual resist pattern as a mask. Furthermore, manufacture of the working reticle is completed by performing a processing such as resist peeling.

Then, the working reticle thereinafter, referred to simply as "reticle R") manufactured as described above is loaded on reticle stage RST of exposure apparatus 10, and after that, setting of an exposure condition such as an illumination condition corresponding to reticle R, wafer replacement, reticle alignment and measurement of the baseline of an alignment system ALG, wafer alignment such as EGA, and the like are sequentially performed, and then, exposure of a step-and-scan method is performed and the pattern of reticle R is severally transferred onto a plurality of shot areas on wafer W. Note that the processing of the above-described series of exposure process has no particular difference from that of a regular scanning stepper, detail description will be omitted.

In this embodiment, as described above, reticle R that was manufactured by using the reticle pattern data composed of pattern elements, whose line width was optimized while taking flare information measured by flare measurement in consideration, is mounted on reticle stage RST and exposure is performed, so that it becomes possible to transfer the pattern on reticle R onto each shot area on wafer W with good accuracy regardless of flare of projection optical system PL.

As it has been described in detail, according to the measurement method performed by exposure apparatus 10 of this embodiment, in which information concerning flare of projection optical system (PL) is measured, illumination light IL is irradiated on the flare measurement mark groups ($MP_1$ to $MP_N$) formed on reticle for measurement RT that is mounted on reticle stage RST being located on the object surface side of projection optical system PL, light intensity distribution of illumination light IL having passed through projection optical system PL and slits 29 formed on slit plate 90 is detected while slit plate 90 (a part of aerial image measuring unit 59) placed on the image plane side of projection optical system PL is moved within a plane perpendicular to the optical axis AX of projection optical system PL, and information concerning flare of projection optical system PL is computed from the light intensity distribution. Thus, unlike the above-described exposing method, development process or the like of the wafer is not necessary, and it becomes possible to perform measurement of information concerning flare in a short time comparing to the exposing method. Further, since the influence of resist can be eliminated, it becomes possible to perform highly accurate measurement of information concerning flare.

Further, according to this embodiment, information concerning flare of projection optical system PL is measured in a short time and highly accurately by the above-described measurement method, a pattern formed on reticle R is decided as described above by taking the measured information concerning flare in consideration, and the decided pattern is formed on reticle (working reticle) R. Then, the pattern formed on reticle R is transferred onto wafer W. Therefore, it becomes possible to form the transferred image of the pattern on wafer W with a desired size regardless of the flare of projection optical system PL.

Meanwhile, in the embodiment above, description has been made for the case where the line width of each pattern element constituting a reticle pattern was corrected by using the flare information obtained by flare measurement, but the present invention is not limited to this. Instead of the correction or together with the correction, an exposure condition of wafer W may be adjusted such that a lens element constituting projection optical system PL is moved or tilted to optical axis AX via an image-forming characteristics correction controller 78, for example. Alternatively, in performing the above-described flare measurement, in-plane distribution of global flare within an image plane is previously measured corresponding to the effective area (static field) in the field of projection optical system PL, a position of an optical element (such as optical integrator) of an illumination optical system is adjusted or the like based on the measurement result, and processing to reduce flare or the like may be performed prior to exposure. The point is that a pattern formed on reticle R should be transferred by taking the measured information concerning flare in consideration.

Note that flare quantity (flare light quantity) generated between the reticle and the wafer can be calculated from contrast C1 (or its converted value) at each evaluation point, which was measured in the embodiment above as follows.

In other words, in the case where exposure quantity of a portion corresponding to a light transmissive portion on wafer W via projection optical system PL is Em, for example, flare quantity Ef can be calculated by the following equation (3).

$$Ef = Em \times \text{contrast value } C1 \text{ (or its converted value)} \quad (3)$$

Further, main controller 50 accumulates a result of flare measurement, and at the point where fluctuation quantity of flare exceeded a threshold value, may notifies an operator of the fact. In such a case, the operator receives the notification and checks the clouded lens (clouded due to degas, acid smudges or the like from resist) closest to the image plane side, which constitutes projection optical system PL, for example, and a cleaning operation for removing the cloudiness of the lens may be performed when it is confirmed that the lens has lost transparency. Further, main controller 50, at the point where at least one of the fluctuation quantity of global flare and the fluctuation quantity of local flare exceeded a threshold value, may notify the operator of the fact from the result of flare measurement. In this case, different threshold values may be set severally to the fluctuation quantity of global flare and the fluctuation quantity of local flare.

Thus, after the fluctuation quantity of flare exceeded the threshold value, a pattern for flare measurement may be transferred onto the resist layer of the wafer via the projection optical system, and influence of flare to resist layer may be actually confirmed.

Note that pattern arrangement on reticle for measurement RT, which has been described in the embodiment above is an example, and it goes without saying that the present invention is not limited to this. For example, only an area similar to the first mark forming area is arranged inside the pattern area of reticle for measurement RT, and 1 or 2 or more of focus measurement marks where an opening pattern is formed inside the light-shielding portion are placed in the area together with the above-described N flare measurement mark groups. For example, the focus measurement marks may be placed in the vicinity of each flare measurement mark group.

Further, as the focus measurement mark, a mark as shown in (1) to (3) below may be used instead of the focus measurement mark of the embodiment above.

Figure 14:
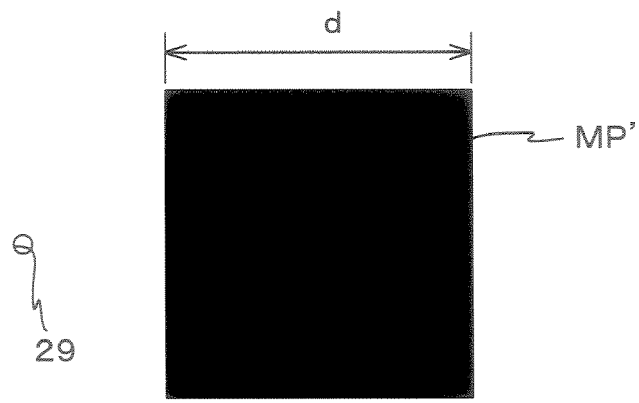
FIG. 14 is a view showing a modified example (1) of a light-shielding pattern and a slit.

(1) As the focus measurement mark, a light-shielding pattern MP' being a square in which the length of one side is d in a converted value on an image plane as shown in FIG. 14, for example is used. In this case, instead of pattern plate 90 on which slits (29x, 29y) are formed, it is desirable to perform flare measurement by using an aerial image measuring unit equipped with a pattern plate in which a pinhole opening 29 is formed as shown in FIG. 14. In such a case, flare in a two-dimensional direction can be directly measured, the above-described conversion of contrast value C1 is not necessary.

Figure 15:
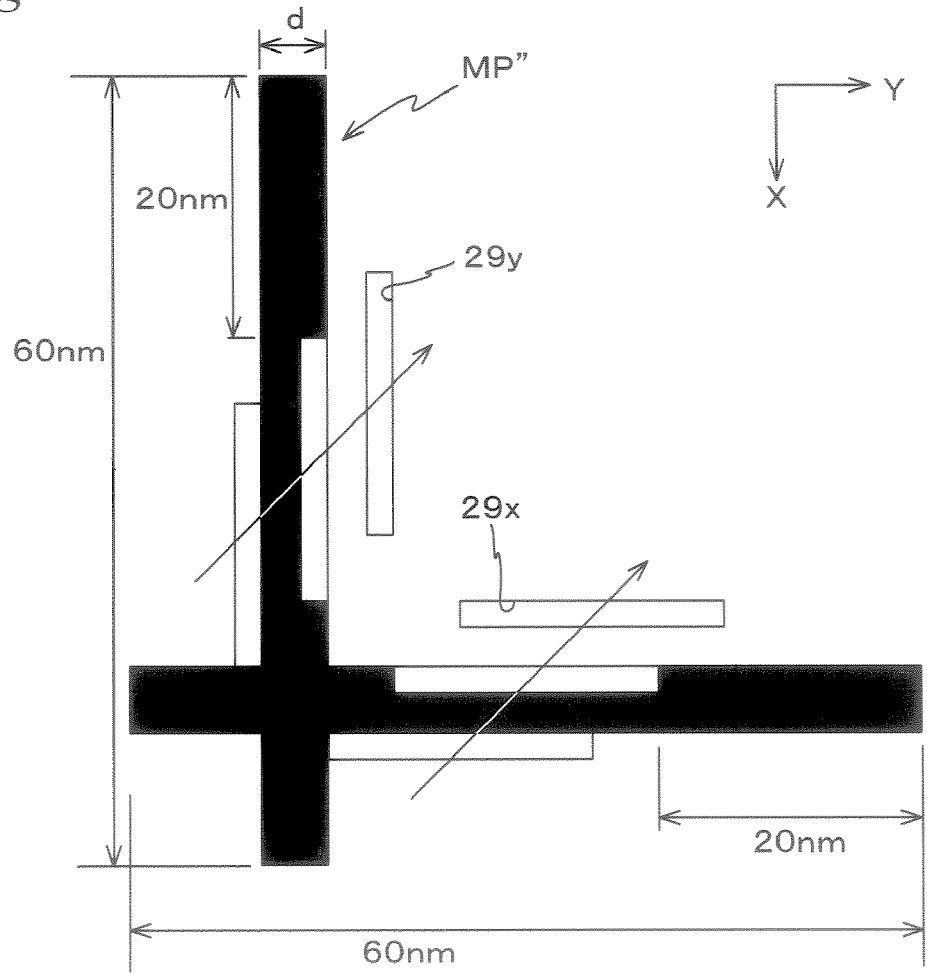
FIG. 15 is a view showing a modified example (2) of a light-shielding pattern and slits.

(2) As the focus measurement mark, as shown in FIG. 15, light-shielding pattern MP'' in which a first portion and a second portion each of which is composed of a light-shielding pattern that an X-axis direction and an Y-axis direction are a longitudinal direction, are crossed in the vicinity of each one end portion may be used. In this case as well, similar to the embodiment above, it is possible to measure flare concerning a one-dimensional direction highly accurately. This is effective particularly when slits (29x, 29y) need to be arranged in close proximity on design of the aerial image measuring unit Note that the size of each section in FIG. 15 is a converted value on the image plane.

Figure 16:
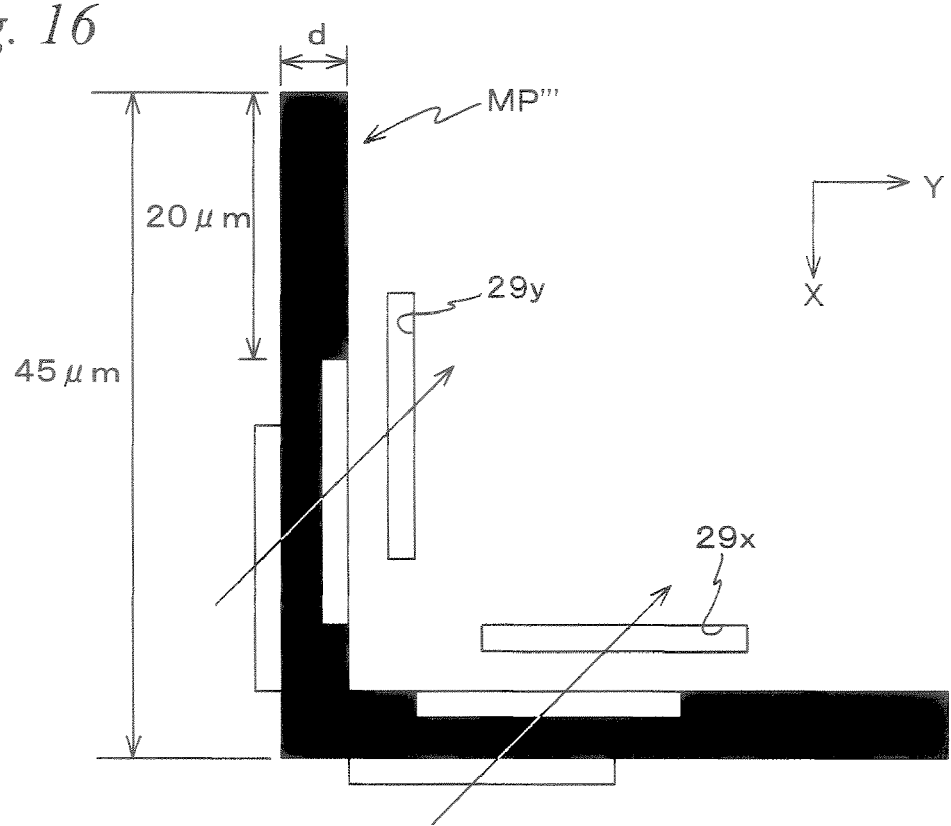
FIG. 16 is a view showing a modified example (3) of a light-shielding pattern and slits.

(3) As the focus measurement mark, as shown in FIG. 16, a light-shielding pattern MP''' having an L-shape may be employed. The size of each section in FIG. 16 is also the converted value on the image plane.

Note that in the flare quantity that is measured in the case of (2) and (3) above, an error is added to flare quantity that is measured by using each mark of flare measurement mark group MP$_n$ employed in the embodiment above, therefore, the error may be measured in advance and a contrast value obtained by flare measurement may be corrected.

Moreover, in the embodiment above, illumination light IL that had transmitted slit 29x and slit 29y was received by a single optical sensor 94, but the arrangement is not limited to this, and illumination light IL that has transmitted slit 29x and illumination light IL that has transmitted slit 29y may be received by separate optical sensors. In this case, in performing flare measurement, slit plate 90 may be scanned in an oblique direction (direction tilted by 45 degrees to X-axis and Y-axis) as the embodiment above, or the slit plate may be scanned in a direction orthogonal to the longitudinal direction of slit 29x or 29y. In the latter case, measurement in the X-axis direction and measurement in the Y-axis direction are performed in tandem temporally.

Further, in the embodiment above, the aerial image measuring unit was used to detect a light intensity signal corresponding to the aerial image of measurement marks projected via the projection optical system however, the configuration is not limited to this. For example, instead of the aerial image measuring unit, an imaging device capable of imaging the entire aerial image of measurement marks may be used to detect the light intensity signal. In this case, the signal can be detected in a state where wafer stage WST and reticle stage RST are stationary.

Note that description has been made for the case where measurement pattern arranged on the pattern plate of the aerial image measuring unit was the opening pattern (slit) 29 in the embodiment above, but the measurement pattern may be a reflective pattern.

Further, in this embodiment, description has been made for the configuration where one wafer stage WST was placed on the image plane side of projection optical system PL and a part of the optical system constituting aerial image measuring unit 59 was placed on wafer stage WST, however, the configuration is not limited to this. For example, another stage may be placed in addition to wafer stage WST and a part of or all of the optical system constituting aerial image measuring unit 59 may be placed on the stage.

Note that the magnification of the projection optical system in the exposure apparatus in the embodiment above may be not only a reduction system but also either an equal magnifying system or a magnifying system, and projection optical system PL may be not only a dioptric system but also either a reflection system or a catadioptric system, and the projected image may be either an inverted image or an upright image.

Further, in the embodiment above, the case has been described where KrF excimer laser light (248 nm), ArF excimer laser light (193 nm) or the like was used as illumination light IL for example. However, the illumination light is not limited to this and g-line (436 nm), i-line (365 nm) or other vacuum ultraviolet light, such as for example, light having a wavelength of 170 nm or less, as in $F_2$ laser light (wavelength: 157 nm) and $Kr_2$ laser light (wavelength: 146 nm) may also be used.

Further, the vacuum ultraviolet light is not limited to the above-described laser light output from each light source, for example, and a harmonic wave may also be used that is obtained by amplifying a single-wavelength laser beam in the infrared or visible range emitted by a DFB semiconductor laser or fiber laser, with a fiber amplifier doped with for example, erbium (Er) (or both erbium and ytterbium (Yb)), and by converting the wavelength into ultraviolet light using a nonlinear optical crystal.

Further, in the embodiment above, the case has been described where the present invention was applied to the projection exposure apparatus of step-and-scan method but besides this the present invention can be applied to an exposure apparatus of step-and-repeat type in which the pattern of a mask is transferred onto a substrate in the state where the mask and the substrate are stationary and the substrate is allowed to make step movement sequentially, an exposure apparatus of step-and-stitch method, or the like.

Further, in the exposure apparatus to which the present invention is applied, it goes without saying that not only light having a wavelength of 100 nm or more but also light having a wavelength of less than 100 nm may be used as illumination light IL of the exposure apparatus. For example, in recent years, in order to expose a pattern of 70 nm or less, development is performed of an EUV exposure apparatus that makes an SOR or a plasma laser as a light source generate an EUV (Extreme Ultraviolet) light in a soft X-ray range (e.g. a wavelength range from 5 to 15 nm) and uses a total reflection reduction optical system designed under the exposure wavelength (e.g. 13.5 nm) and the reflective mask. The present invention can be suitably applied to such an apparatus. Furthermore, for example, the present invention can also be suitably applied to a liquid immersion exposure apparatus that has liquid (such as pure water, filled in between projection optical system PL and a wafer which are disclosed in, for example, the pamphlet of International Publication No. WO99/49504 and the like. The liquid immersion exposure apparatus may be a scanning exposure method using a catadioptric projection optical system, or may be a stationary exposure method using a projection optical system having the projection magnification of ⅛. In the latter immersion type exposure apparatus, it is preferable to employ the above-described step-and-stitch method in order to form a large pattern on an object such as a wafer.

Further, the present invention is not limited to the exposure apparatus for manufacturing semiconductor devices, but can also be applied to exposure apparatuses such as an exposure apparatus used for manufacturing displays including liquid crystal display devices or the like that transfers a device pattern onto a glass plate, an exposure apparatus used for manufacturing thin film magnetic heads that transfers a device pattern onto a ceramic wafer, an exposure apparatus used for manufacturing imaging devices (such as CCDs) micromachines, organic EL, DNA chips or the like. Further, the present invention can also be applied to an exposure apparatus that transfers a circuit pattern onto a glass substrate, a silicon wafer or the like not only when manufacturing microdevices such as semiconductor devices, but also when manufacturing a reticle or a mask used in an optical exposure apparatus, an EUV exposure apparatus, an X-ray exposure apparatus, an electron beam exposure apparatus and the like. Herein, a transmissive reticle is generally used in an exposure apparatus that uses DUV (deep ultraviolet) light, VUV (vacuum ultraviolet) light or the like, and silica glass, fluorine-doped silica glass, fluorite, magnesium fluoride, or crystal or the like is used as a reticle substrate. Further, a transmissive mask (a stencil mask, a membrane mask) is used in an X-ray exposure apparatus by a proximity method, an electron beam exposure apparatus or the like, and a silicon wafer or the like is used as a mask substrate <<Device Manufacturing Method>>

An embodiment of a device manufacturing method in which the exposure method described above is used in a lithography process will be described next.

Figure 18:
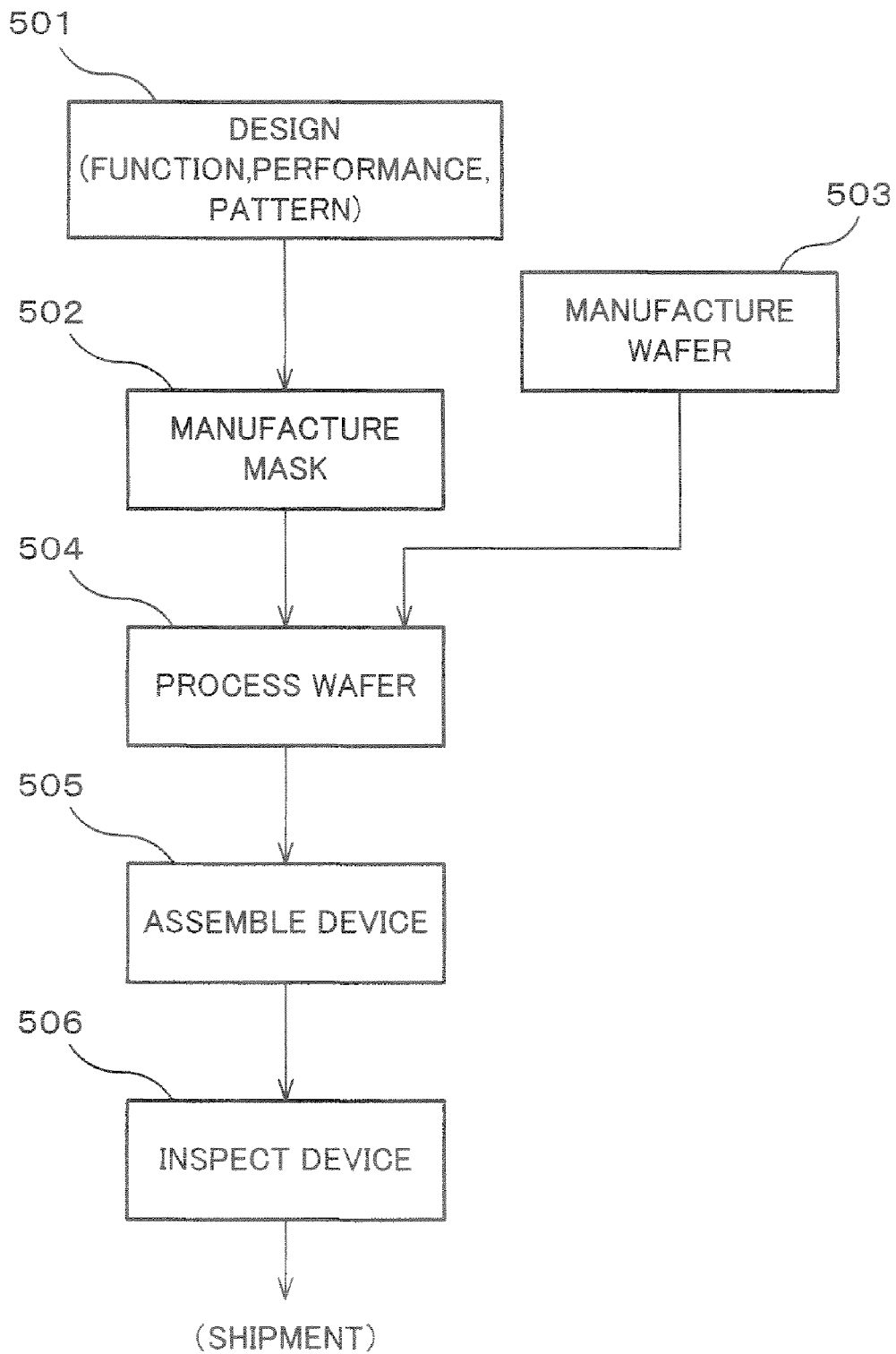
FIG. 18 is a flowchart for explaining a device manufacturing method according to the present invention.

FIG. 18 shows a flowchart of an example when manufacturing a device (a semiconductor chip such as an IC or an LSI, a liquid crystal panel, a CCD, a thin film magnetic head, a micromachine, and the like). As is shown in FIG. 18, first of all, in step 50S (design step), function and performance design of device (such as circuit design of semiconductor device) is performed, and pattern design to realize the function is performed. Then, in step 502 (mask manufacturing step), a mask on which the designed circuit pattern is formed is manufactured. Meanwhile, in step 503 (wafer manufacturing step), a wafer is manufactured using materials such as silicon.

Next, in step 504 (wafer processing step), the actual circuit and the like are formed on the wafer by lithography or the like in a manner that will be described later, using the mask and the wafer prepared in steps 501 to 503. Then, n step 505 (device assembly step), device assembly is performed using the wafer processed in step 504. Step 505 includes processes such as the dicing process, the bonding process, and the packaging process (chip encapsulation), and the like when necessary.

Finally, in step 506 (inspection step), tests on operation, durability, and the like are performed on the devices made in step 505. After these steps, the devices are completed and shipped out.

Figure 19:
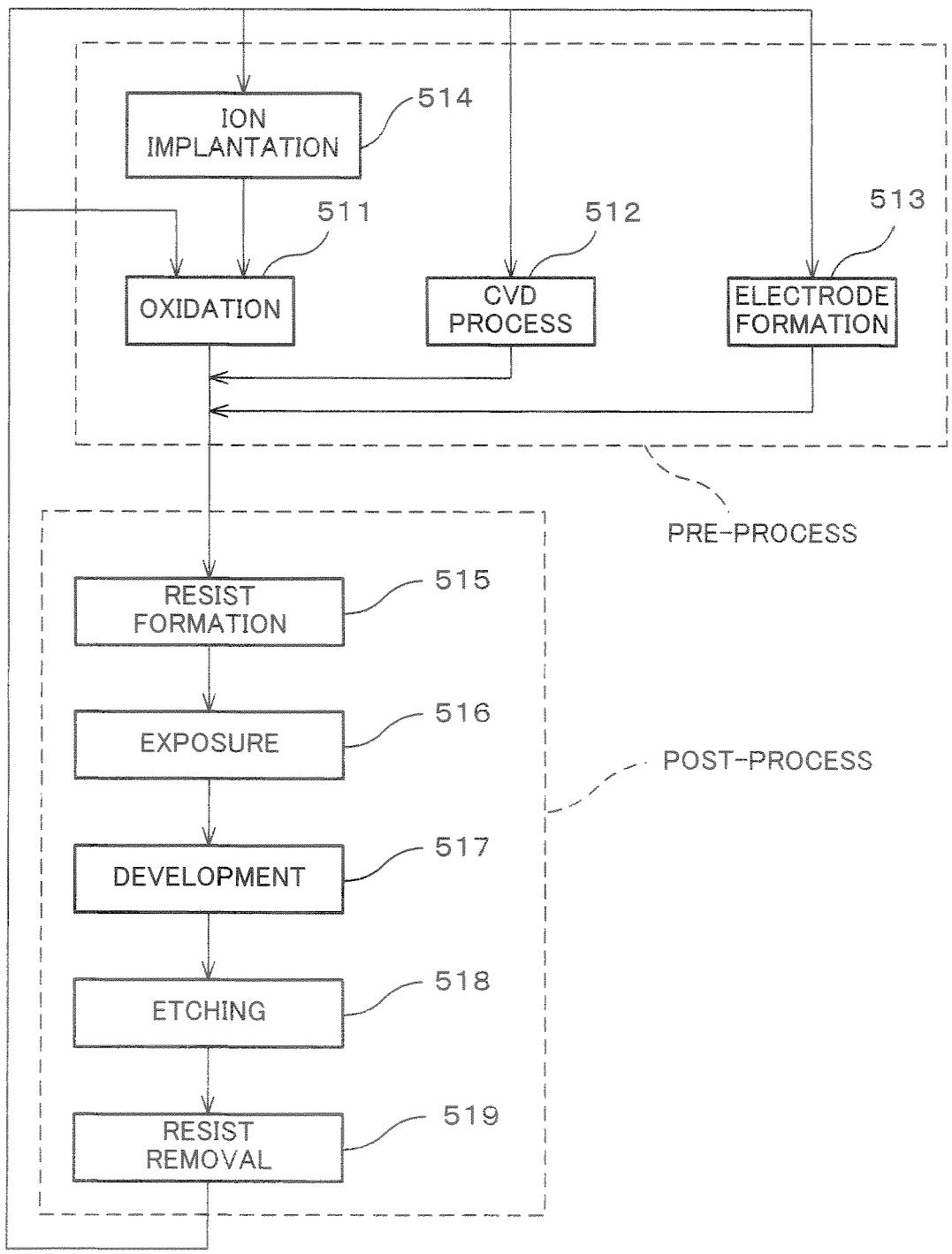
FIG. 19 is a flowchart showing a specific example of step 504.

FIG. 19 is a flow chart showing a detailed example of step 504 described above. Referring to FIG. 19 in step 511 (oxidation step), the surface of wafer is oxidized. In step 512 (CDV step), an insulating film is formed on the wafer surface In step 513 (electrode formation step) an electrode is formed on the wafer by deposition. In step 514 (ion implantation step), ions are implanted into the wafer. Each of the above steps 511 to 514 constitutes the pre-process in each step of wafer processing and the necessary processing is chosen and is executed at each stage.

When the above-described pre-process ends in each stage of wafer processing, post-process is executed as follows. In the post-process, first in step 515 (resist formation step) a photosensitive agent is coated on the wafer. Then, in step 516 (exposure step), the circuit pattern of the mask is transferred onto the wafer by the lithography system (exposure apparatus) and the exposure method described above. Next, in step 517 (development step), the wafer that has been exposed is developed, and in step 518 (etching step) an exposed member of an area other than the area where resist remains is removed by etching. Then, in step 519 (resist removing step) when etching is completed, the resist that is no longer necessary is removed.

By repeatedly performing the pre-process and the post-process, multiple circuit patterns are formed on the wafer.

By using the device manufacturing method of the embodiment described above, because the measurement method in the embodiment above is used in the design step (step 501) and the exposure method in the embodiment above is used in the exposure step (step 516), exposure with high accuracy can be obtained. Accordingly, the productivity (including the yield, of highly integrated microdevices on which fine patterns are formed can be improved.

INDUSTRIAL APPLICABILITY

As it has been described above, the measurement method of the present invention is suitable for measuring information concerning the flare of a projection optical system. Further, the exposure method of the present invention is suitable for transferring a pattern formed on a mask onto a substrate. Furthermore, the device manufacturing method of the present invention is suitable for producing a microdevice.

What is claimed is:

1. A measurement method in which information concerning flare of a projection optical system is measured, the method comprising:
   irradiating light on a light-shielding pattern placed on an object surface side of the projection optical system and forming an image of the light-shielding pattern on an image surface side of the projection optical system via the projection optical system;
   moving a predetermined measurement pattern of a measurement instrument placed on the image surface side of the projection optical system, within a plane perpendicular to an optical axis of the projection optical system;
   detecting a light intensity distribution of light via the measurement pattern while moving the measurement pattern with respect to the image of the light-shielding pattern; and
   computing the information concerning flare of the projection optical system from the light intensity distribution detected in the detecting the light intensity distribution.

2. The measurement method according to claim 1 wherein in the computing the information concerning flare, the computed information concerning flare is converted, based on a relation between information concerning flare measured by an exposing method and the information concerning flare computed from the light intensity distribution detected in the detecting the light intensity distribution.

3. The measurement method according to claim 1 wherein
   the light-shielding pattern has a rough shape of a square, and
   the measurement pattern includes a pinhole-shaped pattern having a shape smaller than a shape of the image of the light-shielding pattern formed on the image surface side of the projection optical system.

4. The measurement method according to claim 1, further comprising:
   changing an irradiation condition for irradiating the light-shielding pattern and detecting a best focus position under the changed irradiation condition, prior to the irradiating the light on the light-shielding pattern and forming the image.

5. The measurement method according to claim 4 wherein
   the light-shielding pattern is formed on a measurement mask, and
   the measurement mask includes an evaluation mark that is used for detecting the best focus position.

6. An exposure method, comprising:
   measuring the information concerning flare of the projection optical system by the measurement method according to claim 1; and
   transferring a pattern formed on a mask onto a substrate by taking the measured information concerning flare into consideration.

7. The exposure method according to claim 6 wherein
   in the transferring the pattern, the projection optical system is adjusted based on the measured information concerning flare, and the pattern formed on the mask is transferred onto a substrate.

8. An exposure method, comprising:
   measuring the information concerning flare of the projection optical system by the measurement method according to claim 1;
   deciding a pattern to be formed on a mask by taking the measured information concerning flare into consideration and forming the pattern on the mask; and
   transferring the pattern formed on the mask onto a substrate.

9. A device manufacturing method, including:
   a lithography process in which a pattern formed on a mask is transferred onto a substrate by using the exposure method according to claim 6.

10. A device manufacturing method, including:
    a lithography process in which a pattern formed on a mask is transferred onto a substrate by using the exposure method according to claim 8.

11. The measurement method according to claim 1 wherein
    the light-shielding pattern includes a first portion extending in a first direction within a plane orthogonal to the optical axis of the projection optical system.

12. The measurement method according to claim 11 wherein
    the light-shielding pattern includes a second portion extending in a second direction orthogonal to the first direction within a plane orthogonal to the optical axis of the projection optical system.

13. The measurement method according to claim 12 wherein
    the light-shielding pattern includes a common portion that is formed by a part of the first portion and a part of the second portion crossing and that belongs to both the first portion and the second portion.

14. The measurement method according to claim 12 wherein
the measurement instrument has two measurement patterns that are formed corresponding to the first and the second portions.

15. The measurement method according to claim 12 wherein
the light intensity distribution is detected while the measurement pattern is moved in a direction crossing the first and the second directions.

16. The measurement method according to claim 15 wherein
the measurement instrument includes two sensors corresponding to the two measurement patterns.

17. The measurement method according to claim 16 wherein
the measurement patterns have dimensions which are not influenced from flare from both end sides in a longitudinal direction of the light-shielding pattern.

18. The measurement method according to claim 11 wherein
the computed information concerning flare is converted by doubling.

* * * * *